(12) United States Patent
Takano et al.

(10) Patent No.: US 12,117,781 B2
(45) Date of Patent: Oct. 15, 2024

(54) POSITIONING CONTROL DEVICE AND METHOD FOR MOVING A MECHANICAL LOAD BY A TARGET DISTANCE USING A MOTOR

(71) Applicant: Mitsubishi Electric Corporation, Tokyo (JP)

(72) Inventors: Naoto Takano, Tokyo (JP); Masaya Kimura, Tokyo (JP); Hidetoshi Ikeda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 376 days.

(21) Appl. No.: 17/780,036

(22) PCT Filed: Dec. 26, 2019

(86) PCT No.: PCT/JP2019/051237
§ 371 (c)(1),
(2) Date: May 26, 2022

(87) PCT Pub. No.: WO2021/130988
PCT Pub. Date: Jul. 1, 2021

(65) Prior Publication Data
US 2022/0413453 A1 Dec. 29, 2022

(51) Int. Cl.
*G05B 13/02* (2006.01)
(52) U.S. Cl.
CPC ............... *G05B 13/0265* (2013.01)
(58) Field of Classification Search
None
See application file for complete search history.

(56) References Cited

U.S. PATENT DOCUMENTS 5,267,144 A 11/1993 Yoshida et al.
6,577,908 B1 6/2003 Wojsznis et al.
(Continued)

FOREIGN PATENT DOCUMENTS

| JP | 2-87209 A | 3/1990 |
| JP | 4-227509 A | 8/1992 |

(Continued)

OTHER PUBLICATIONS

Jin et al. 'A fine-interpolation-based parametric interpolation method with a novel real-time look-ahead algorithm' Computer-Aided Design 55 (2014) 37-48, published 2014.*
(Continued)

*Primary Examiner* — Bernard G Lindsay
(74) *Attorney, Agent, or Firm* — XSENSUS LLP

(57) ABSTRACT

A positioning control device, in which motion of a motor in positioning operation of causing a mechanical load connected to the motor to move by a target moving distance is specified by operational conditions and command parameters, includes an adjustment unit performing the positioning operation based on an adjustment condition and a trial parameter, which are an operational condition and a command parameter, and determining one of the command parameters to be an excellent parameter corresponding to the adjustment condition based on an evaluation result based on the state of the motor or the mechanical load during positioning operation performed; and an estimation unit determining one of the command parameters to be an estimated excellent parameter corresponding to a non-adjustment condition, which is one type of the operational conditions, based on an adjustment record being a pair of the adjustment condition and the excellent parameter corresponding to the adjustment condition.

16 Claims, 15 Drawing Sheets

(56) References Cited

U.S. PATENT DOCUMENTS

| | | | |
|---|---|---|---|
| 6,687,554 B1 | 2/2004 | Kishi et al. | |
| 10,102,314 B2 | 10/2018 | Miura et al. | |
| 10,895,866 B1* | 1/2021 | Bae | H02K 29/06 |
| 2013/0257339 A1* | 10/2013 | Kim | H02P 23/14 |
| | | | 318/561 |
| 2017/0174461 A1* | 6/2017 | Kimura | G05B 13/024 |
| 2018/0149473 A1* | 5/2018 | Sprenger | G01B 5/008 |
| 2020/0059180 A1* | 2/2020 | Dixon | H02P 21/0003 |
| 2022/0004160 A1 | 1/2022 | Kimura et al. | |

FOREIGN PATENT DOCUMENTS

| | | |
|---|---|---|
| JP | 4-324507 A | 11/1992 |
| JP | 2000-339005 A | 12/2000 |
| JP | 2003-61377 A | 2/2003 |
| JP | 2004-240609 A | 8/2004 |
| JP | 2005-110396 A | 4/2005 |
| JP | 2007-135344 A | 5/2007 |
| JP | 2010-218007 A | 9/2010 |
| JP | 2011-3186 A | 1/2011 |
| JP | 2015-27246 A | 2/2015 |
| WO | 2020/075316 A1 | 4/2020 |
| WO | 2021/053784 A1 | 3/2021 |

OTHER PUBLICATIONS

International Search Report and Written Opinion mailed on Mar. 3, 2020, received for PCT Application PCT/JP2019/051237, Filed on Dec. 26, 2019, 10 pages including English Translation.

\* cited by examiner

POSITIONING CONTROL DEVICE AND METHOD FOR MOVING A MECHANICAL LOAD BY A TARGET DISTANCE USING A MOTOR

CROSS-REFERENCE TO RELATED APPLICATION

The present application is based on PCT filing PCT/JP2019/051237, filed Dec. 26, 2019, the entire contents of which are incorporated herein by reference.

FIELD

The present disclosure relates to a positioning control device that controls positioning performed using a motor.

BACKGROUND

An electronic component-mounting apparatus, semiconductor manufacturing equipment, and the like provide positioning control to move the position of a mechanical part such as a mounting head by a target distance by motor drive. The time required for positioning in positioning control can be reduced and productivity of the apparatus can thus be improved by setting an optimum value for a parameter that specifies a time-series pattern of a command signal for driving the apparatus, a parameter for a control system, and/or the like. Such setting of a parameter requires a trial-and-error adjustment in a case in which the moved machine part is a low-rigidity machine part, which oscillates easily. This presents a problem in that adjustment work takes time and effort. In addition, the time required for adjustment work, the result of adjustment, and the like largely depend on the knowledge and experience of the worker, thereby presenting a problem in that adjustment quality varies from worker to worker. Technology for solving the foregoing problems has been proposed in which a parameter is set using a command pattern prepared in advance.

Patent Literature 1 discloses a method for automatically adjusting an electric motor control device that automatically tunes a control parameter in feedback control, feedforward control, or the like. The automatic adjustment method disclosed in Patent Literature 1 performs adjustment in which multiple position command patterns for adjustment operation that change continuously are generated to increase the response frequencies of a position controller and of a speed controller under a condition that the oscillation amplitude of a positional deviation waveform will not exceed a predetermined value when a position command pattern is given as a position command value for the position controller.

CITATION LIST

Patent Literature

Patent Literature 1: Japanese Patent Application Laid-open No. 2007-135344

SUMMARY

Technical Problem

The automatic adjustment method of Patent Literature 1 selects a single optimum control parameter for all the position command patterns. This presents a problem in low suitability of a control parameter for individual position command patterns, thereby leading to low controllability. In addition, the need for operation with respect to many position command patterns presents a problem of taking a long time for adjustment.

The present disclosure has been made for the foregoing, and it is an object of the present disclosure to provide a positioning control device requiring less time for adjustment and capable of performing a high-performance positioning operation.

Solution to Problem

A positioning control device according to the present disclosure is a positioning control device in which motion of a motor in a positioning operation of causing a mechanical load mechanically connected to the motor to move by a target moving distance is specified by operational conditions and by command parameters, the command parameters being parameters changeable under the operational conditions. The positioning control device includes: an adjustment unit to perform adjustment in which the positioning operation is performed based on an adjustment condition and on a trial parameter, and one of the command parameters is determined to be an excellent parameter corresponding to the adjustment condition based on an evaluation result, the adjustment condition being one type of the operational conditions, the trial parameter being one type of the command parameters, the evaluation result being based on a state sensor signal that represents a state of the motor or of the mechanical load detected during the positioning operation performed; an adjustment record storage unit to store a pair of the adjustment condition and the excellent parameter corresponding to the adjustment condition, as an adjustment record; and an estimation unit to determine, based on the adjustment record, one of the command parameters to be an estimated excellent parameter corresponding to a non-adjustment condition, the non-adjustment condition being one type of the operational conditions different from the adjustment condition stored in the adjustment record.

Advantageous Effects of Invention

The present disclosure can provide a positioning control device requiring less time for adjustment and capable of performing a high-performance positioning operation.

DESCRIPTION OF EMBODIMENTS

Embodiments will be described in detail below with reference to the drawings. Note that the embodiments described below are merely examples. In addition, the embodiments may be practiced in combination as appropriate.

First Embodiment

Figure 1:
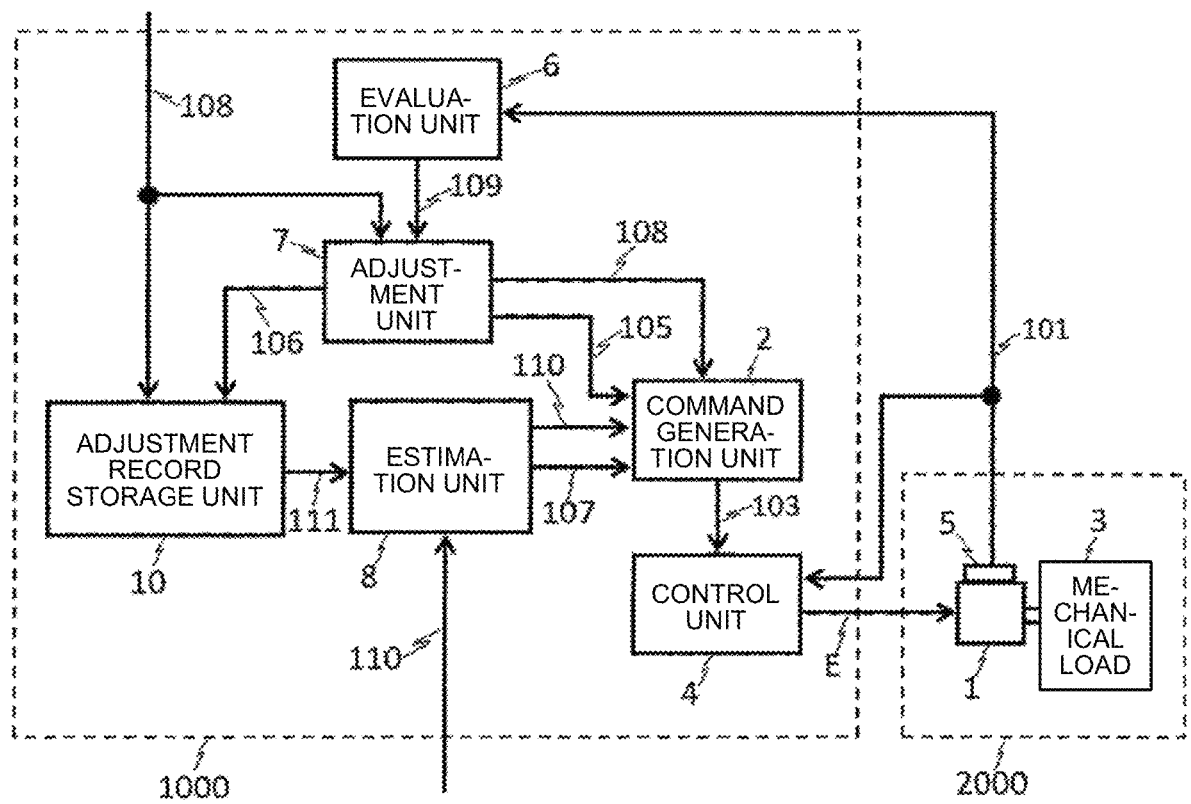
FIG. 1 is a block diagram illustrating an example of a configuration of a positioning control device in a first embodiment.

FIG. 1 is a block diagram illustrating an example of a configuration of a positioning control device 1000 in the present embodiment. The positioning control device 1000 includes a command generation unit 2, which determines a command signal 103 based on a trial parameter 105 and on an adjustment condition 108; and a control unit 4, which performs a positioning operation by driving a motor 1 based on the command signal 103. The positioning control device 1000 also includes an adjustment unit 7, which performs adjustment and determines an excellent parameter 106 corresponding to the adjustment condition 108. The positioning control device 1000 further includes an adjustment record storage unit 10, which stores an adjustment record 111; and an estimation unit 8, which estimates, as an estimated excellent parameter 107, the excellent parameter 106 corresponding to the adjustment condition 108 based on the adjustment record 111.

The motor 1 generates torque, thrust, or the like by drive power E output from the control unit 4. Examples of the motor 1 include a rotary servomotor, a linear motor, and a stepper motor. The motor 1 is mechanically connected with a mechanical load 3, which is driven by the motor 1. As the mechanical load 3, a device that is operated by torque, thrust, or the like generated by the motor 1 and that performs a positioning operation with respect to the mechanical load 3 may be selected as appropriate. The term positioning operation, as used herein, refers to an operation of moving the mechanical load 3 by a target moving distance. Examples of the mechanical load 3 include an electronic component-mounting apparatus and semiconductor manufacturing equipment. In addition, the positioning operation may cause movement of the entirety of the mechanical load 3 or movement of a part that is a movable part of the mechanical load 3. The motor 1 and the mechanical load 3 are referred to collectively as a control target 2000.

The control unit 4 supplies the drive power E to the motor 1 based on the command signal 103 thus to drive the motor 1 and cause the motor 1 to follow the command signal 103. The command signal 103 represents a command value for the motor 1, and may represent the command value in terms of, for example, a position, a speed, an acceleration, a torque, or a current with respect to the motor 1. The control unit 4 can be configured as appropriate to cause the position of the motor 1 to follow the command signal 103. For example, a feedback control system may be used that calculates the torque or current of the motor 1 using PID control to reduce the difference between a detected position of the motor 1 and the command signal 103. Alternatively, the control unit 4 may use a two-degree-of-freedom control system utilizing, in combination, feedforward control and feedback control which drives the motor 1 to cause the detected position of the mechanical load 3 to follow the command signal 103. The positioning control device 1000 can be configured not to include the control unit 4 as a component thereof. For example, a set of a memory, a processor, and the like external to the positioning control device 1000 may be configured to drive the motor 1 to follow the command signal 103 similarly to the control unit 4 of FIG. 1.

A state sensor 5 detects the state of at least one of the motor 1 or the mechanical load 3, i.e., the state of the control target 2000, as a state sensor signal 101. Examples of state quantity include a position, a speed, an acceleration, a current, a torque, and a thrust of the motor 1. Other examples of the state quantity include a position, a speed, and an acceleration of the mechanical load 3. The state quantity may include all or part of the above-mentioned examples. Examples of the state sensor 5 include an encoder, a laser displacement meter, a gyro sensor, an acceleration sensor, a current sensor, and a force sensor. The following description assumes that the state sensor 5 of FIG. 1 is an encoder that detects the position of the motor 1 as the state quantity.

The adjustment unit 7 performs a positioning operation based on the adjustment condition 108, which is one type of operational conditions, and on the trial parameter 105, which is one type of command parameters. The adjustment unit 7 then determines one of the command parameters to be an excellent parameter 106 corresponding to the adjustment condition 108 based on an evaluation result 109 based on the state sensor signal 101, which represents the state of the motor 1 or of the mechanical load 3 detected during the positioning operation performed. The foregoing sequence of operations performed by the adjustment unit 7 is referred to herein as adjustment. Note that in the adjustment operation described above, the adjustment unit 7 may determine multiple trial parameters 105 to perform the positioning operation multiple times each based on the adjustment condition 108 and on the corresponding one of the trial parameters.

Terms for use in description of adjustment performed by the adjustment unit 7 will now be described. A time-series pattern of a command value in terms of the position, the speed, the acceleration, or the like for the motor 1 during a positioning operation is referred to as command pattern. In the present embodiment, a command pattern is determined by the adjustment condition 108 and by the trial parameter 105. In other words, determination of the adjustment condition 108 and the trial parameter 105 uniquely determines a command pattern during a positioning operation, which in turn determines the motion of the motor. The adjustment condition 108 is a type of operational conditions. An operational condition is a condition that restricts the motion of the motor 1 during the positioning operation. An operational condition includes at least one numerical parameter that specifies the motion of the motor 1. This numerical parameter is referred to as operational parameter. The operational parameter may include the target moving distance. The target moving distance is the target value of the moving distance of the mechanical load 3 in a positioning operation.

A command parameter represents a command that specifies the motion of the motor 1, and that is input to the command generation unit 2. The command generation unit 2 determines the command signal 103 based on the command parameter. The control unit 4 then drives the motor 1 based on the command signal 103. In addition, the trial parameter 105, the excellent parameter 106 (described later), an estimated excellent parameter 107 (described later), and the like form a group of command parameters, and can each be considered as a designation for classifying the command parameters into respective types. The trial parameter 105 is one type of command parameters, and is a parameter that is changeable under the adjustment condition 108. Note that various alterations of the trial parameter 105 using the adjustment condition 108 as a constraint condition enable positioning operation to be performed with various command patterns under the constraint condition described above. Specific examples of the trial parameter 105, the command pattern, the adjustment condition 108, and the like will be described later with reference to FIG. 2.

The adjustment unit 7 receives the adjustment condition 108. In the present embodiment, the adjustment condition 108 may be determined by the worker or by a device inside or outside the positioning control device 1000. The adjustment unit 7 determines at least one trial parameter 105 under the adjustment condition 108. The command generation unit 2 then receives the adjustment condition 108 and the trial parameter 105 determined, and generates the command signal 103. The control unit 4 performs a positioning operation based on the command signal 103. In other words, the adjustment unit 7 performs a positioning operation based on the adjustment condition 108 and on the trial parameter 105. An evaluation unit 6 determines, as the evaluation result 109, a result of evaluation of the positioning operation performed, based on the aforementioned state sensor signal 101. Note that the evaluation of the positioning operation performed by the evaluation unit 6 also serves as evaluation of the trial parameter 105 used in the positioning operation. Note also that in a case in which multiple trial parameters 105 have been determined, the control unit 4 performs a positioning operation based on each of combinations of the adjustment condition 108 and the trial parameters 105 determined. The operation to be performed by the evaluation unit 6 to evaluate the positioning operation, i.e., the trial parameter 105, will be described later.

The adjustment unit 7 receives the evaluation result 109, and determines one of the command parameters to be the excellent parameter 106 corresponding to the adjustment condition 108, based on the evaluation result 109 received. The excellent parameter 106 is a type of command parameters. Note that a command parameter leading to performing a positioning operation that provides a good evaluation result 109 may be determined to be the excellent parameter 106. In such a case, the excellent parameter 106 varies depending on the evaluation method used by the evaluation unit 6, and setting a desired method as the evaluation method for use by the evaluation unit 6 enables performance demanded for the positioning operation to be selected. The adjustment unit 7 can determine one of the command parameters to be the excellent parameter 106 based on the evaluation result 109. By way of example, the trial parameter 105 that has provided the best evaluation result 109 of positioning operation performed during adjustment may be determined to be the excellent parameter 106. Otherwise, by way of example, two trial parameters 105 that have provided good evaluation results 109 of positioning operation performed during adjustment may be selected, and the median thereof may be determined to be the excellent parameter 106.

In addition, the sequence of operations from the reception of the adjustment condition 108 to the determination of the excellent parameter 106 corresponding to the adjustment condition 108 performed by the adjustment unit 7 is referred to herein as adjustment. In the present embodiment, the adjustment unit 7 performs a positioning operation once or multiple times to obtain the evaluation result 109 for each positioning operation. A pair of the adjustment condition 108 and the excellent parameter 106 determined is stored as an adjustment record 111 in the adjustment record storage unit 10. An operation of associating the adjustment condition 108 with the excellent parameter 106 will next be described. This association may be formed based on input timing. For example, such association may be formed by pairing the adjustment condition 108 and the excellent parameter 106 that is input immediately after the adjustment condition 108 was input. The association may also be formed by assigning an identifier to both the adjustment condition 108 and the excellent parameter 106.

The estimation unit 8 receives a non-adjustment condition 110. The non-adjustment condition 110 is a type of operational conditions. The non-adjustment condition 110 may be an operational condition different from the adjustment condition 108 stored by the adjustment record storage unit 10. The estimation unit 8 then determines one of the command parameters to be the estimated excellent parameter 107 corresponding to the non-adjustment condition 110, based on the adjustment record 111. The estimated excellent parameter 107 is a type of command parameters. The excellent parameter 106 is determined through adjustment performed by the adjustment unit 7. The excellent parameter 106 may be, by way of example, a command parameter leading to performing a positioning operation that provides a good evaluation result 109 under the adjustment condition 108. Meanwhile, the estimated excellent parameter 107 is one of command parameters, determined to be the estimated excellent parameter 107 corresponding to the non-adjustment condition 110 through estimation performed by the estimation unit 8. In this operation, the estimation unit 8 can determine one of the command parameters to be the estimated excellent parameter 107 based on the adjustment record 111, and may use various methods. By way of example, the estimation unit 8 may estimate one of the command parameters that provide a good evaluation result 109 under the non-adjustment condition 110, and determine that command parameter to be the estimated excellent parameter 107. By way of example, the estimation unit 8 may estimate one of the command parameters that are likely to provide the best evaluation result 109, and determine that command parameter to be the estimated excellent parameter 107. Alternatively, the estimation unit 8 may select several best command parameters that are likely to provide good evaluation results 109, and determine the average value thereof to be the estimated excellent parameter 107. Although the example configuration of FIG. 1 illustrates the non-adjustment condition 110 as being provided from an external device, a component for determining the non-adjustment condition 110 may be provided inside the positioning control device 1000. Note that although, in the present embodiment, the example configuration of FIG. 1 illustrates the estimated excellent parameter 107 and the non-adjustment condition 110 as being input to the command generation unit 2, the estimated excellent parameter 107 and the non-adjustment condition 110 do not necessarily need to be input to the command generation unit 2. For example, the estimated excellent parameter 107 and the non-adjustment condition 110 may be output to an external device, or stored by the adjustment record storage unit 10.

Figure 2:
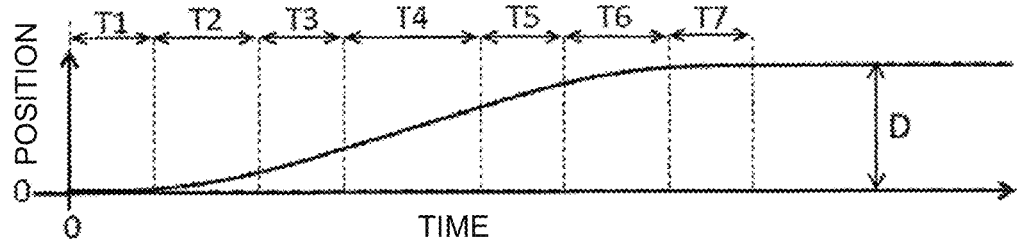
FIG. 2 is a diagram illustrating an example of command patterns in the first embodiment.
Figure 2:
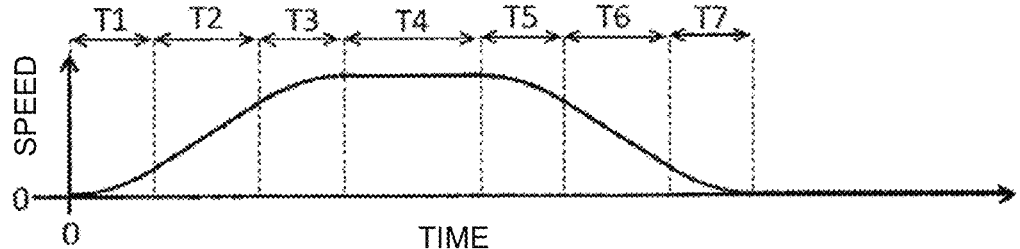
Figure 2:
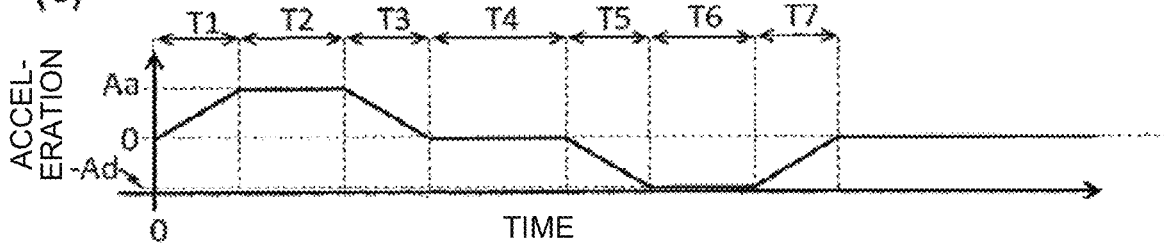
Figure 2:
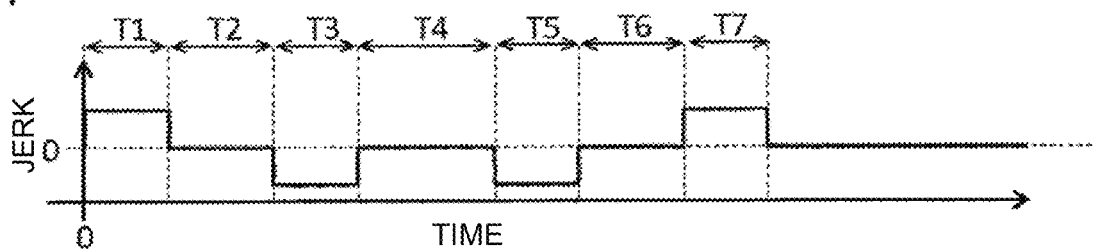

A specific example of the trial parameter 105, the command pattern, the adjustment condition 108, and the like will be described below by way of example. FIG. 2 is a diagram illustrating an example of command patterns in the present embodiment. The horizontal axes of (a) in FIG. 2 to (d) in FIG. 2 represent time. The vertical axes of (a) in FIG. 2 to (d) in FIG. 2 represent, respectively, the position, the speed, the acceleration, and the jerk of the motor 1. These are each the command signal 103. The speed, the acceleration, and the jerk are, respectively, the first derivative, the second derivative, and the third derivative of the position of the motor 1. The intersection between the horizontal axis and the vertical axis represents time 0 on the horizontal axis, which is the time point of starting the command at which an evaluation operation is started. The operational condition in the example operation of FIG. 2 is assumed to be a target moving distance of a value D. That is, the motor 1 is positioned at position 0 at time 0 at which the evaluation operation is started, and at position D at time t=T1+T2+T3+T4+T5+T6+T7, which is the end time.

The command patterns of FIG. 2 are each segmented into intervals sequentially from a first interval to a seventh interval in a time period from time 0, which is the time point of starting the command, to the end time. The time length of an n-th interval is designated n-th time length Tn, where n is a natural number from 1 to 7. The example operation of FIG. 2 illustrates seven parameters from first time length T1 to seventh time length T7, as constituting one trial parameter 105. That is, the set of seven parameters is herein considered as one trial parameter 105. Let Aa and Ad respectively denote the magnitudes of acceleration in the second interval and in the sixth interval, and assume that Aa and Ad are constant in the respective intervals. One should keep in mind that the magnitude Aa of acceleration and the magnitude Ad of acceleration are dependent variables of the trial parameter 105, and therefore have no setting flexibility. Note that the example of FIG. 2 assumes that the time series of a command signal 103 is a command pattern, and therefore, a numerical value of the command pattern at any time is herein designated the command signal 103.

The command signals 103 at time t (0≤t<T1) in the first interval can be calculated as follows. Integration of the jerk, acceleration A1, and speed V1 over time from time 0 of the first interval to time t in the first interval yields acceleration A1, speed V1, and position P1, respectively. The acceleration increases at a constant rate in the first interval and reaches the magnitude Aa of acceleration at time T1, so that the jerk in the first interval has a value obtained by division of the magnitude Aa of acceleration by time T1. Thus, acceleration A1, speed V1, and position P1 can be respectively calculated as shown by Equations (1) to (3).

[Formula 1]

$$A1(t) = \int_0^t \frac{Aa}{T1} d\tau \quad (1)$$

[Formula 2]

$$V1(t) = \int_0^t A1(\tau) d\tau \quad (2)$$

[Formula 3]

$$P1(t) = \int_0^t V1(\tau) d\tau \quad (3)$$

In addition, similarly to the calculation of the first interval, the command signals 103 at time t (T1≤t<T1+T2) in the second interval, i.e., acceleration A2, speed V2, and position P2, can be respectively calculated as shown by Equations (4) to (6).

[Formula 4]

$$A2(t) = Aa \quad (4)$$

[Formula 5]

$$V2(t) = V1(T1) + \int_{T1}^{t} A2(\tau) d\tau \quad (5)$$

[Formula 6]

$$P2(t) = P1(T1) + \int_{T1}^{t} V2(\tau) d\tau \quad (6)$$

In addition, similarly to the calculation of the first interval, the command signals 103 at time t (T1+T2≤t<T1+T2+T3) in the third interval, i.e., acceleration A3, speed V3, and position P3, can be respectively calculated as shown by Equations (7) to (9).

[Formula 7]

$$A3(t) = Aa + \int_{T1+T2}^{t} \frac{-Aa}{T3} d\tau \quad (7)$$

[Formula 8]

$$V3(t) = V2(T1+T2) + \int_{T1+T2}^{t} A3(\tau) d\tau \quad (8)$$

[Formula 9]

$$P3(t) = P2(T1+T2) + \int_{T1+T2}^{t} V3(\tau) d\tau \quad (9)$$

In addition, similarly to the calculation of the first interval, the command signals 103 at time t (T1+T2+T3≤t<T1+T2+T3+T4) in the fourth interval, i.e., acceleration A4, speed V4, and position P4, can be respectively calculated as shown by Equations (10) to (12).

[Formula 10]

$$A4(t) = 0 \quad (10)$$

[Formula 11]

$$V4(t) = V3(T1+T2+T3) + \int_{T1+T2+T3}^{t} A4(\tau) d\tau \quad (11)$$

[Formula 12]

$$P3(t)=P3(T1+T2+T3)+\int_{T1+T2+T3}^{t}V4(\tau)d\tau \qquad (12)$$

In addition, similarly to the calculation of the first interval, the command signals 103 at time t (T1+T2+T3+T4≤t<T1+T2+T3+T4+T5) in the fifth interval, i.e., acceleration A5, speed V5, and position P5, can be respectively calculated as shown by Equations (13) to (15).

[Formula 13]

$$A5(t) = \int_{T1+T2+T3+T4}^{t} \frac{-Ad}{T5} d\tau \qquad (13)$$

[Formula 14]

$$V5(t) = V4(T1 + T2 + T3 + T4) + \int_{T1+T2+T3+T4}^{t} A5(\tau)d\tau \qquad (14)$$

[Formula 15]

$$P5(t) = P4(T1 + T2 + T3 + T4) + \int_{T1+T2+T3+T4}^{t} V5(\tau)d\tau \qquad (15)$$

In addition, similarly to the calculation of the first interval, the command signals 103 at time t (T1+T2+T3+T4+T5≤t<T1+T2+T3+T4+T5+T6) in the sixth interval, i.e., acceleration A6, speed V6, and position P6, can be respectively calculated as shown by Equations (16) to (18).

[Formula 16]

$$A6(t)=-Ad \qquad (16)$$

[Formula 17]

$$V6(t)=V5(T1+T2+T3+T4+T5)+\int_{T1+T2+T3+T4+T5}^{t}A6(\tau)d\tau \qquad (17)$$

[Formula 18]

$$P6(t)=P5(T1+T2+T3+T4+T5)+ \int_{T1+T2+T3+T4+T5}^{t}V6(\tau)d\tau \qquad (18)$$

In addition, similarly to the calculation of the first interval, the command signals 103 at time t (T1+T2+T3+T4+T5+T6≤t≤T1+T2+T3+T4+T5+T6+T7) in the seventh interval, i.e., acceleration A7, speed V7, and position P7, can be respectively calculated as shown by Equations (19) to (21).

[Formula 19]

$$A7(t) = -Ad + \int_{T1+T2+T3+T4+T5+T6}^{t} \frac{Ad}{T7} d\tau \qquad (19)$$

[Formula 20]

$$V7(t) = V6(T1 + T2 + T3 + T4 + T5 + T6) + \int_{T1+T2+T3+T4+T5+T6}^{t} A7(\tau)d\tau \qquad (20)$$

[Formula 21]

$$P7(t) = P6(T1 + T2 + T3 + T4 + T5 + T6) + \int_{T1+T2+T3+T4+T5+T6}^{t} V7(\tau)d\tau \qquad (21)$$

Then, at time t=T1+T2+T3+T4+T5+T6+T7, which is the end time, speed V7 reaches 0, and position P7 reaches the target moving distance D. Thus, Equations (22) and (23) are satisfied at the end time. The magnitude Aa of acceleration in the second interval and the magnitude Ad of acceleration in the sixth interval can be determined from Equations (22) and (23).

[Formula 22]

$$V7=0 \qquad (22)$$

[Formula 23]

$$P7=D \qquad (23)$$

The foregoing is an example of operation performed by the command generation unit 2 of generating a command signal 103 based on the trial parameter 105 and on the adjustment condition 108. In this operation, the jerk has a non-zero constant value in the first interval, in the third interval, in the fifth interval, and in the seventh interval. That is, first time length T1, third time length T3, fifth time length T5, and seventh time length T7 each specify the time duration in which the jerk has a non-zero constant value. A non-zero constant value means a constant value greater than zero or a constant value less than zero. In addition, in these intervals, the magnitude of jerk can be used as the trial parameter 105 instead of time length Tn. For example, first time length T1 and jerk J1 have a relationship expressed by Equation (24) where J1 is the magnitude of jerk in the first interval.

[Formula 24]

$$J1 = \frac{Aa}{T1} \qquad (24)$$

Use of the time length of an interval in which the jerk has a non-zero constant value as the trial parameter 105 is equivalent to use of the magnitude of jerk in an interval in which the jerk has a non-zero constant value as the trial parameter 105. As in the example described above, the trial parameter 105 only needs to enable a command pattern to be determined based on the trial parameter 105 and on the adjustment condition 108, and may thus have multiple alternatives even under the same adjustment condition 108 as illustrated herein using the example. Note that the method of selecting the trial parameter 105 is not limited to the method described above. In the method described with reference to FIG. 2, the maximum acceleration of the motor 1 is determined by determining the operational condition and the command parameter. That is, the patterns of FIG. 2 illustrate an example in which a combination of the operational condition and the command parameter provides the maximum value of acceleration of the motor 1 during a positioning operation. In such a case, a command parameter can be sought that leads to performing a positioning operation that provides a good evaluation result 109 while altering the command parameter under a constraint condition that the maximum acceleration of the motor 1 is not exceeded. Note that, in many cases, the maximum acceleration of the motor is determined by the specifications of the motor, which allows easy adjustment by using the foregoing configuration.

Figure 3A:
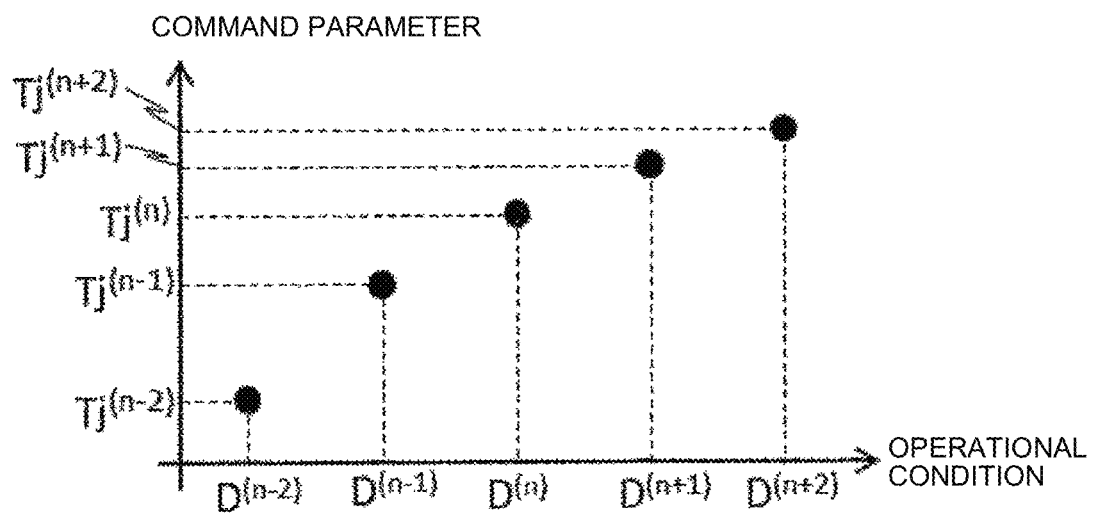
FIG. 3 is a diagram illustrating examples of relationship between an operational condition and a command parameter in the first embodiment.
Figure 3B:
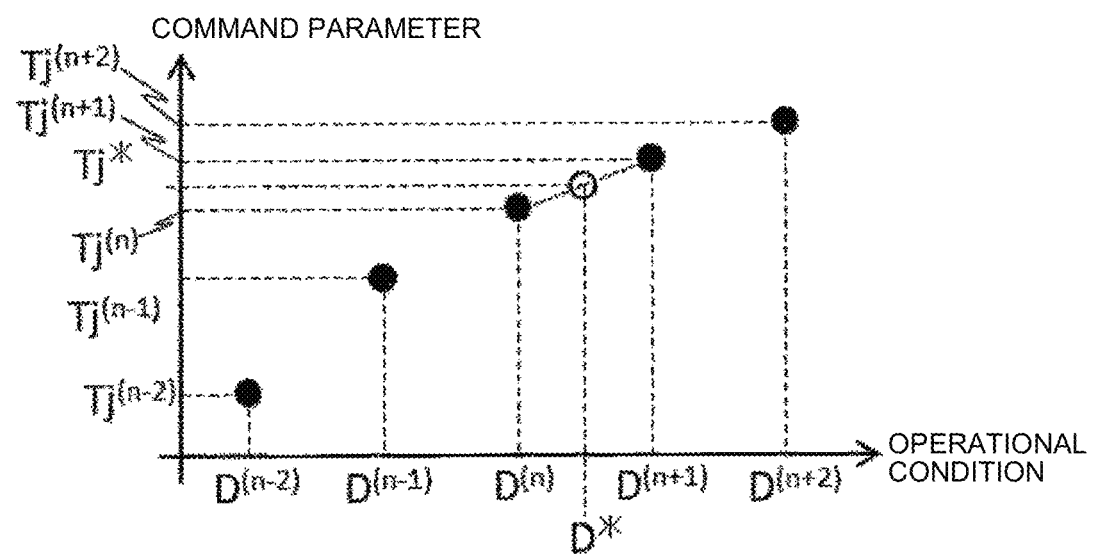

FIG. 3 is a diagram illustrating examples of relationship between the operational condition and the command parameter in the present embodiment. Note that an operational condition illustrated in FIG. 3 is the adjustment condition 108 or the non-adjustment condition 110, and a command parameter illustrated in FIG. 3 is the excellent parameter 106 or the estimated excellent parameter 107. The horizontal axes of FIG. 3 each represent the target moving distance, which is one of the operational parameters. The vertical axes of FIG. 3 each represent the command parameter. FIGS. 3A and 3B plot the adjustment record 111. That is, FIGS. 3A and 3B plot the adjustment condition 108 and the excellent parameter 106 corresponding to the adjustment condition 108 using solid symbols, i.e., black circle marks. Note that the target moving distance D (n) represents the n-th adjustment condition 108, and $Tj^{(n)}$ represents the j-th time length at the target moving distance $D^{(n)}$, where n is an integer greater than or equal to 3, and j is an integer from 1 to 7. In addition, $Tj^{(n)}$ is the j-th parameter of the n-th excellent parameters 106, that is, the j-th time length in the example of FIG. 2. As such, the example of FIG. 2 assumes that seven time lengths constitute one command parameter.

Note that, for clarity of illustration, FIG. 3 only illustrates a j-th parameter included in the command parameter to illustrate the excellent parameters 106. As illustrated with respect to the example operation of FIG. 2, even when one command parameter includes multiple parameters, the multiple parameters constituting the command parameter can each be plotted in a similar manner. Moreover, in a case in which the operational condition also includes one or multiple operational parameters in addition to the target moving distance, the operational parameters may be plotted in a multidimensional space having a coordinate axis system for each of the operational parameters, rather than on a two-dimensional plane such as one used in FIG. 3. Now, let Ln denote an adjustment record 111, which is a pair of the n-th adjustment condition 108 and the n-th excellent parameters 106. The n-th adjustment record Ln can be expressed as Equation (25) as a pair of the n-th target moving distance $D^{(n)}$ and the n-th excellent parameters 106.

[Formula 25]

$$L_n = (D^{(n)}, T1^{(n)}, T2^{(n)}, T3^{(n)}, T4^{(n)}, T5^{(n)}, T6^{(n)}, T7^{(n)}) \quad (25)$$

Note that although FIG. 3 illustrates five positions of the adjustment record 111 from the (n−2)-th one to the (n+2)-th one, the number of data points of the adjustment record 111 only needs to be one or more, and is preferably two or more. A higher number of data points of the adjustment record 111 enables the estimation unit 8 to estimate an estimated excellent parameter 107 with higher precision. FIG. 3B plots, in addition to the data points illustrated in FIG. 3A, a non-adjustment condition D* and an estimated excellent parameter Tj* corresponding to the non-adjustment condition D* in the interval between $D^{(n)}$ and $D^{(n+1)}$ using an open mark, i.e., a white circle mark. The estimation unit 8 may estimate the estimated excellent parameter Tj* using linear interpolation based on the adjustment record 111 as expressed by Equation (26).

[Formula 26]

$$Tj^* = \frac{Tj^{(n+1)} - Tj^{(n)}}{D^{(n+1)} - D^{(n)}} D^* + \frac{D^{(n+1)}Tj^{(n)} - D^{(n)}Tj^{(n+1)}}{D^{(n+1)} - D^{(n)}} \quad (26)$$

Equation (26) uses a linear, first-order approximation equation using the adjustment record Ln and the adjustment record Ln+1 near the non-adjustment condition D* to determine the estimated excellent parameter Tj*. In other words, the estimation unit 8 estimates the estimated excellent parameter 107 by using a linear interpolation function that provides approximation using operational parameters and excellent parameters 106 respectively as the input and the output. The estimation unit 8 may also perform interpolation-based estimation using, instead of a linear interpolation function, a P-dimensional function, which is an approximate polynomial of a P-th degree, such as one expressed by Equation (27). Equation (27) can also be written as Equation (28) using the summation sign Σ.

[Formula 27]

$$Tj^* = aj^{(0)} + aj^{(1)}D^* + aj^{(2)}d^{2*} + \ldots + aj^{(u)}D^{u*} \quad (27)$$

[Formula 28]

$$Tj^* = \Sigma_{u=0}^{P} aj^{(u)} D^{u*} \quad (28)$$

The coefficient $aj^{(u)}$ in Equation (28) is a constant dependent on the adjustment record 111, the boundary condition, and the like. In addition to linear interpolation and polynomial interpolation described above by way of example, an approximation technique such as Lagrange interpolation, spline interpolation, or the like may be used to estimate the estimated excellent parameter 107. Thus, the foregoing has provided an example of operation performed by the estimation unit 8 to estimate, based on the adjustment records 111, the estimated excellent parameter 107 as a command parameter that provides excellent performance of positioning control under the non-adjustment condition 110. Note that although the present embodiment has been described with respect to a case in which the operational parameter of the adjustment condition 108 is only the target moving distance, an operational parameter other than the target moving distance may be additionally used. Examples of the operational parameter include the starting position and the stop position of the mechanical load 3 in positioning operation. An alteration of the starting position, the stop position, and/or the like of the motion while the target moving distance is kept the same may cause a change in the characteristic of the mechanical load 3, thereby in turn causing a change in the magnitude of the amplitude of oscillation that may occur, the frequency of oscillation that may occur, the nature of damping of oscillation that may occur, or the like, which may require readjustment of the command parameter. In other words, the starting position, the stop position, and the like of the mechanical load 3 in positioning operation have an effect on the evaluation result 109 of the positioning operation, i.e., how well a positioning operation will be performed.

Note that the estimation unit 8 may calculate the highest acceleration in all positioning operations each performed based on the adjustment condition 108 and on the excellent parameter 106 corresponding to the adjustment condition 108 included in the adjustment record 111. The estimated excellent parameter 107 may then be determined to cause the highest acceleration value in positioning operations performed based on the non-adjustment condition 110 and on the estimated excellent parameter 107 corresponding to the non-adjustment condition 110 to be less than the above calculated value. Such determination of the estimated excellent parameter 107 enables a combination of a non-adjustment condition 110 and an estimated excellent parameter 107 that would produce impracticable thrust or torque to be eliminated from the estimation result provided by the estimation unit 8. This then enables efficient searching, using a combination of adjustment and estimation, for a command parameter that leads to performing a positioning operation that provides a good evaluation result 109 under a given operational condition.

Moreover, the operational parameter may also be the degree of inertia of the mechanical load 3, the ambient temperature, or the like. The degree of inertia of the mechanical load 3 depends on the mass of the machine or the like. The positioning control device 1000 may be subject to different disturbance depending on the degree of inertia, on the ambient temperature, and/or on the like, which may affect the performance of positioning operation. A numerical value having an effect on controllability may be employed as an operational parameter serving as the adjustment condition 108 as described above to configure a device capable of providing high-performance positioning control depending on each operational parameter. In addition, although description has been provided by way of example for a case in which the mechanical load 3 moves linearly, and the positioning control device 1000 controls linear positioning, the disclosure of the present embodiment is also applicable to a case in which, for example, the movable part of the mechanical load 3 rotates, and the positioning control device 1000 controls rotary positioning. In such a case, an angle, an angular speed, and an angular acceleration may be respectively used instead of a position, a speed, and an acceleration.

In a case in which the adjustment condition 108 includes multiple operational parameters, and the operational parameters may each take multiple values, the adjustment condition 108 may be generated for each of combinations of the operational parameters and the values thereof. An example of the adjustment condition 108 is as follows. For example, assume that the operational parameters are the target moving distance that can take five values and the degree of inertia of the mechanical load 3 that can take three values. In such a case, given the number of the adjustment conditions 108 as M=15, an entity that supplies the adjustment condition 108 to the adjustment unit 7 and to the adjustment record storage unit 10 may store the fifteen adjustment conditions 108 in a table. The term table refers to a set of data stored in such a manner that a numerical value obtained when the value of an independent variable is altered can be read in association with the independent variable. An example of where the table is stored is a data-readable storage device. In addition, the entity that supplies the adjustment condition 108 may be, for example, a component such as the operational condition determination unit 11 illustrated in FIG. 9.

Figure 4:
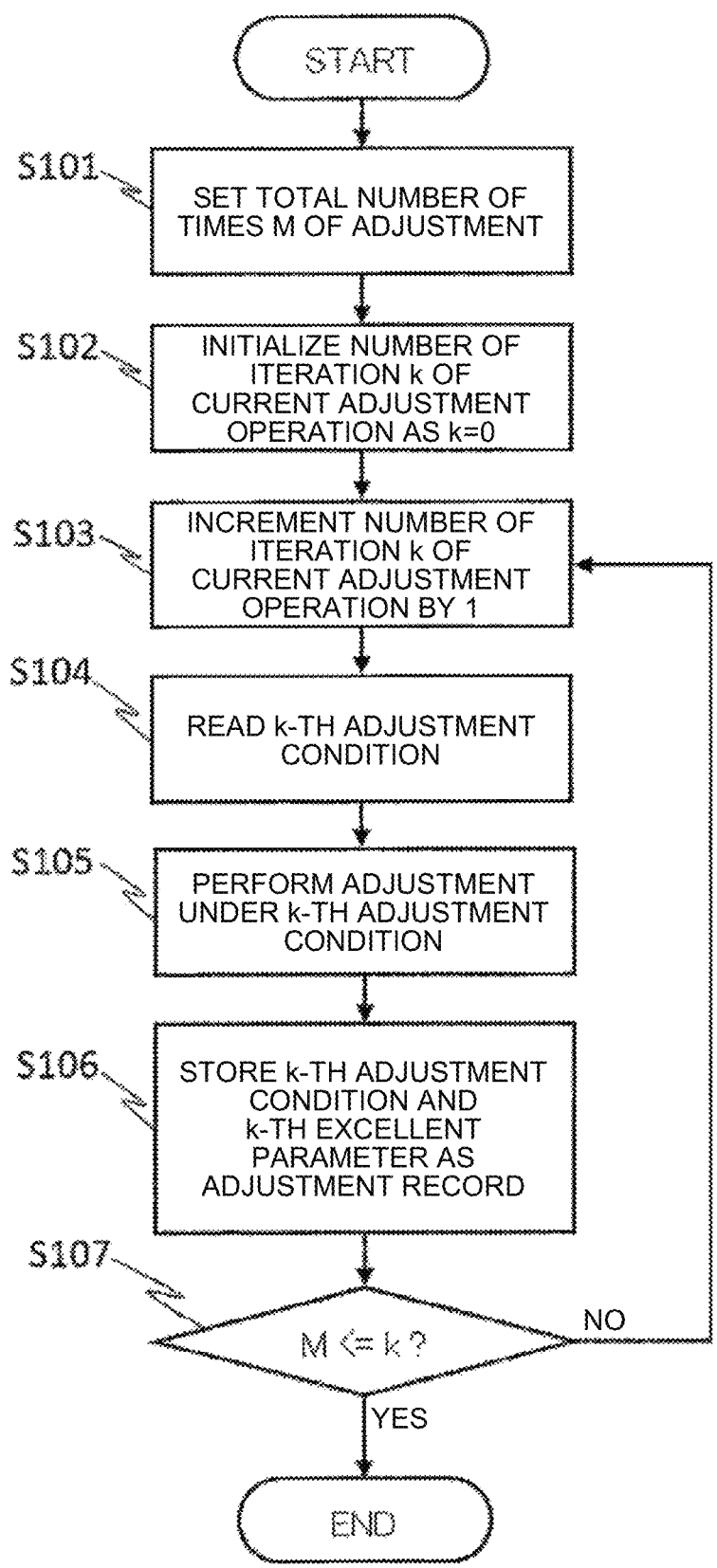
FIG. 4 is a flowchart illustrating an example of adjustment operation in the first embodiment.

FIG. 4 is a flowchart illustrating an example of adjustment operation in the present embodiment. The adjustment unit 7 sets, at step S101, the total number of times M the adjustment is performed. The number M may be the total number of the adjustment conditions 108. At step S102, the adjustment unit 7 initializes the number of iteration k of the current adjustment operation as k=0. In this operation, step S101 and step S102 may be performed in any order, and part or all of these two operations may be simultaneously performed. Next, at step S103, the adjustment unit 7 increments the number of iteration k of the current adjustment operation. That is, the adjustment unit 7 adds one to k. Next, at step S104, the adjustment unit 7 reads a k-th adjustment condition 108 of the M adjustment conditions 108. Note that the description with reference to FIG. 4 describes an example in which all the adjustment conditions 108 are in advance determined and stored in a table, from which an applicable one is read, but the adjustment condition 108 may be determined each time step S104 is performed without determining the adjustment conditions 108 beforehand.

Next, at step S105, the adjustment unit 7 performs adjustment described later under the k-th adjustment condition 108, and determines the excellent parameter 106 corresponding to the k-th adjustment condition 108 as the k-th excellent parameter 106. Next, at step S106, the adjustment record storage unit 10 stores, as the adjustment record 111, the k-th adjustment condition and the k-th excellent parameter 106 in association with each other. Next, at step S107, the adjustment unit 7 determines whether k is greater than or equal to M. At step S107, if k is determined to be less than M, the process proceeds to step S103. The process flow is then repeated from step S103 to step S107 until k is determined to be greater than or equal to M at step S107. Alternatively, if k is determined to be greater than or equal to M at step S107, adjustment work for all the adjustment conditions 108 is terminated. Performing the process flow illustrated in FIG. 4 causes the adjustment record storage unit 10 to store the adjustment record 111, which is a pair of the adjustment condition 108 and the excellent parameter 106 corresponding to the adjustment condition 108, for all the M adjustment conditions 108.

Figure 5A:
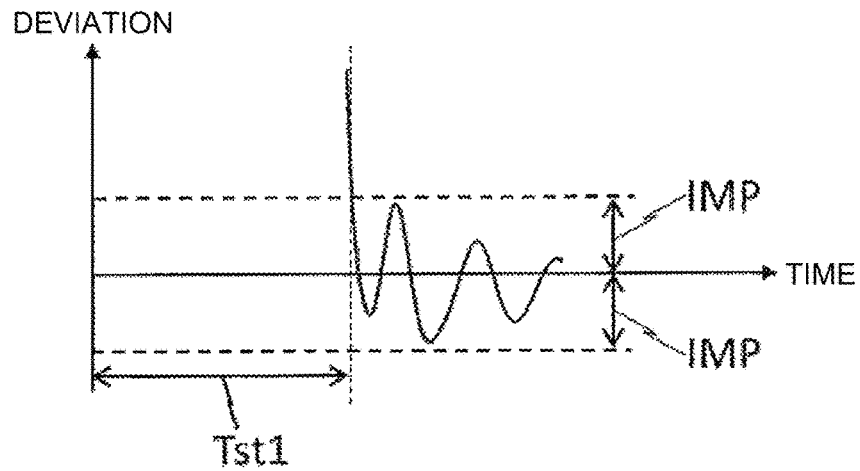
FIG. 5 is a diagram illustrating examples of time response of a deviation in the first embodiment.
Figure 5B:
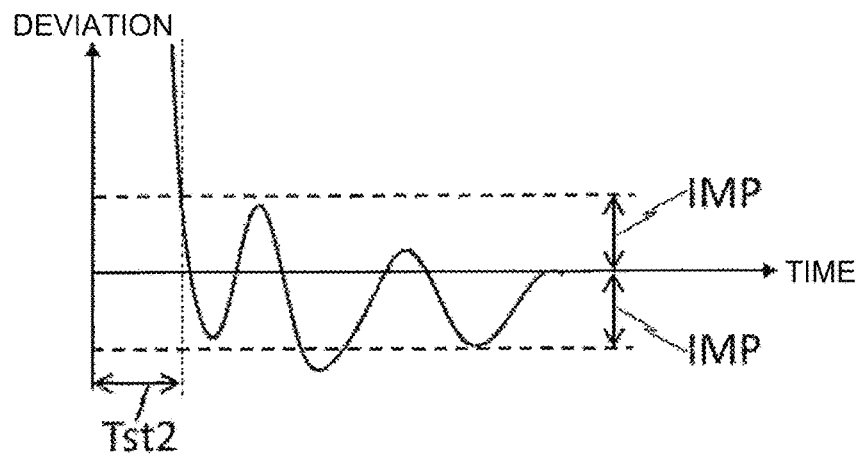
Figure 5C:
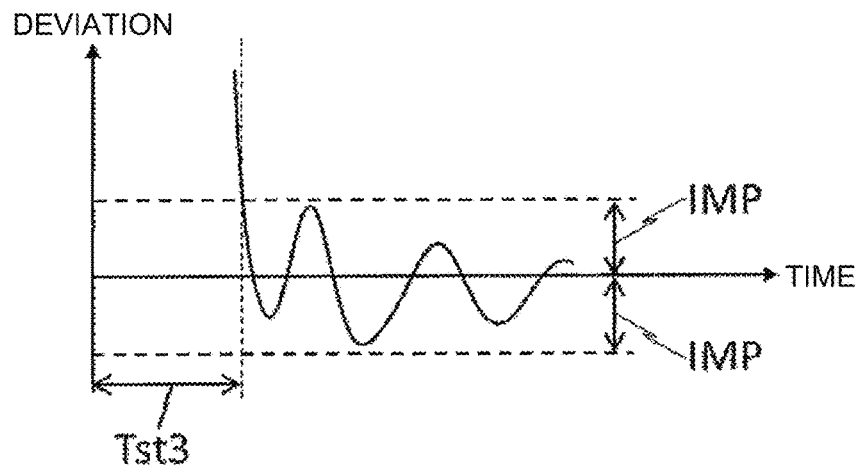

A configuration and an operation of the evaluation unit 6 will next be described by way of example. FIG. 5 is a diagram illustrating examples of time response of a deviation in the present embodiment. The term deviation refers to herein as the difference between the target moving distance and the position of the motor 1. In the example operation of FIG. 5, the position of the motor 1 has been detected by the state sensor 5 as the state sensor signal 101. FIGS. 5A to 5C illustrate respective temporal waveforms of deviation in a positioning operation based on respective different trial parameters 105. When the command generation unit 2 generates the command signal 103 based on the trial parameter 105, and the control unit 4 then performs a positioning operation based on the command signal 103 generated, the positioning operation performed is referred to herein as positioning operation based on the trial parameter 105. The trial parameter 105 may also include multiple parameters similarly to the example of FIG. 2, in which one trial parameter 105 includes seven time lengths.

In the example illustrated in FIG. 5, a tolerance IMP is determined in advance to detect a positioning completion time point, which tolerance IMP is a criterion of precision of positioning control. In addition, the time period from the start of positioning control until the magnitude of the deviation first falls to or below the tolerance IMP is referred to herein as settling time. The settling time may be longer than the termination time T1+T2+T3+T4+T5+T6+T7, which is the time required for a command pattern to terminate, but may also be shorter than the termination time due to an effect of machine oscillation or the like.

In the example operation of FIG. 5A, the settling time is Tst1, after which the magnitude of the deviation never exceeds the tolerance IMP before the amplitude converges. In the example operation of FIG. 5B, the settling time is Tst2, after which the magnitude of the deviation once exceeds the tolerance IMP before the amplitude converges. In FIG. 5C, the settling time is Tst3, after which the magnitude of the deviation never exceeds the tolerance IMP before the amplitude converges. It is assumed here that the settling time Tst3 is less than the settling time Tst1, and is greater than the settling time Tst2 (Tst2<Tst3<Tst1). Two requirements are assumed here: the deviation never exceeds the tolerance IMP after the settling time, and a positioning time is reduced, where the positioning time is a time period from the start of a positioning operation until the deviation first falls below a predetermined value. Assume also that the three positioning operations respectively illustrated in FIGS. 5A to 5C are performed under the same adjustment condition 108. In such a case, the example operation of FIG. 5C exhibits the highest controllability, and the trial parameter 105 that causes the positioning operation of FIG. 5C to be performed may therefore be determined to be the excellent parameter 106. The evaluation result 109 may be determined based on the positioning time as described above. Note that the positioning time is described as originating at the time of start of a positioning operation, but the origination point is not limited to such time. For example, a time point that is a certain time period before or after the time of start of a positioning operation may be used as the origination point.

The evaluation unit 6 may determine the evaluation result based on a combination of the settling time and overshoot information, which is information about whether the magnitude of the deviation will exceed the tolerance IMP during a time period after the lapse of the positioning time until a predetermined time period elapses. Such determination of the evaluation result 109 based on overshoot information can reduce the possibility of selection, as the excellent parameter 106, of the trial parameter 105 that leads to performing an operation that causes the magnitude of the deviation to exceed the tolerance IMP after completion of the positioning operation. In addition, it is possible to reduce the possibility of selection, as the excellent parameter 106, of the trial parameter 105 that leads to performing a positioning operation that causes the deviation to have a large oscillation amplitude. Moreover, an operation may be performed in which the evaluation unit 6 outputs a value of an evaluation function E expressed by Equation (29) as the evaluation result, and in which the adjustment unit 7 performs adjustment aiming at minimization of the evaluation function E based on understanding that a smaller value of the evaluation function E indicates higher controllability. Alternatively, the inverse of Equation (29) may be used as the evaluation function to cause the adjustment unit 7 to perform adjustment aiming at maximization of the evaluation function based on understanding that a larger value of the evaluation function indicates higher controllability.

[Formula 29]

$$E = Tst + L \times Pe \quad (29)$$

Tst in the first term of the right-hand side of Equation (29) is the settling time. In addition, $L \times Pe$ in the second term is a term of penalty determined based on the overshoot information. Pe in the second term is a numerical value representing whether a penalty is to be imposed or not. For example, the value of Pe may be 1 when the magnitude of the deviation has exceeded a tolerance, and 0 when the magnitude of the deviation has not exceeded the tolerance during a time period after completion of the positioning operation and before a certain time period elapses. In addition, L in the second term is a positive constant that determines the magnitude of the penalty. A higher value of L means that the evaluation function of Equation (29) depends more on the penalty than on the settling time, in the case of which adjustment is performed with priority given to avoidance of the penalty. In contrast, a lower value of L means that the evaluation function depends more on the settling time than on the penalty, in the case of which adjustment is performed with priority given to reduction of the settling time. Thus, the foregoing has provided an example of configuration and operation of the evaluation unit 6.

Note that the configuration of the evaluation unit 6 is not limited to the foregoing. For example, the evaluation result 109 may be calculated using a time integral value of the deviation and a time integral value of the thrust of the motor 1. In addition, an optimal regulator may be used that calculates the evaluation result 109 using these values in combination. Alternatively, an index may be used that is the maximum value of excess of the position with respect to the target moving distance, during a time period from when the magnitude of the deviation first falls to or below the tolerance and before a predetermined time period elapses. Otherwise, the evaluation result 109 may be determined based on the amount of overshoot that is the excess distance from the position corresponding to the target moving distance in the direction opposite the starting point of the positioning operation with respect to the ending point of the positioning operation. Still alternatively, the maximum acceleration in the command pattern or the maximum speed in the command pattern may be used as the evaluation result. Moreover, these values may be used in combination. Note that the positioning control device 1000 may be configured not to include the evaluation unit 6 as a component thereof. For example, a set of a memory and a processor, a processor, or the like external to the positioning control device 1000 may evaluate a positioning operation, that is, evaluate the trial parameter 105, based on the state sensor signal 101, similarly to the evaluation unit 6 of FIG. 1.

Figure 6:
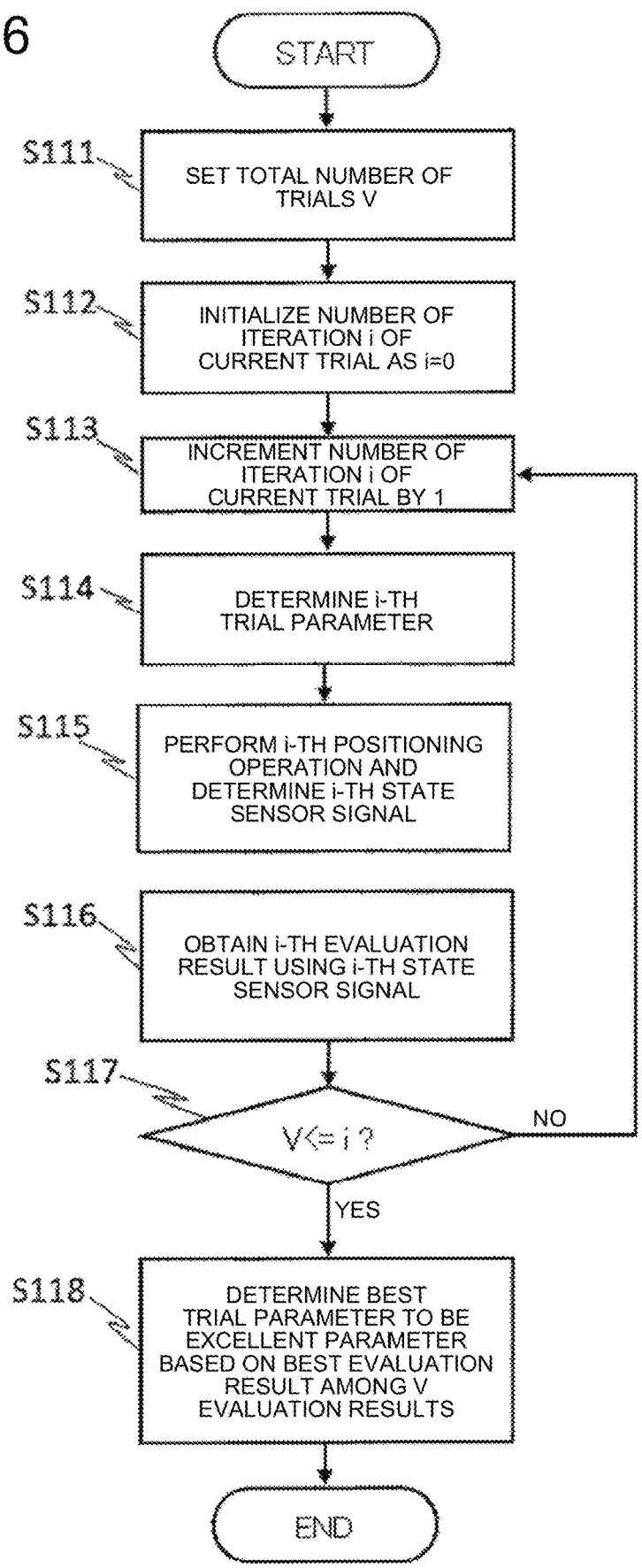
FIG. 6 is a flowchart illustrating an example of adjustment operation in the first embodiment.

FIG. 6 is a flowchart illustrating an example of adjustment operation in the present embodiment. After start of an adjustment operation, the adjustment unit 7 sets, at step S111, the total number of trials V, which is the total number of times a trial for the positioning operation is performed under a single adjustment condition 108. At step S112, the adjustment unit 7 initializes the number of iteration i of the current trial. For example, the number i may be set as i=0. The example operation of FIG. 6 assumes that V trial parameters 105 are prepared in advance, and when performing i-th positioning operation, an i-th trial parameter 105 is set out of the V trial parameters 105 prepared.

An example of a method of setting the trial parameter 105 is a round robin technique called grid search. An example will next be described of grid search performed on the trial parameter 105 including seven time lengths described by way of example with reference to FIG. 2 in the present embodiment. Multiple values that can be taken by first time length T1 are set. The setting values may include a value of zero. First time length T1 of zero means that the time length from the start of operation to the time when the acceleration of the command signal 103 reaches the maximum acceleration is zero. Similarly to the case of first time length T1, several discrete numbers that can be taken by each parameter are set for each of the six time lengths from second time length T2 to seventh time length T7. One should keep in mind that the seven time lengths cannot take a negative value. Next, the combination of the values that have been set is set in advance as the trial parameter 105. Assume, for example, that a single trial parameter 105 includes seven parameters from first time length T1 to seventh time length T7, and that three discrete values are set for each time length. In such a case, there are as many as the seventh power of three, i.e., 2187 combinations, that is, the number of the trial parameters 105 is 2187. In this case, the total number of trials may be set as V=2187. Thus, the foregoing has provided an example of setting of the trial parameter 105 using grid search.

Next, at step S113, the adjustment unit 7 increments the number of iteration i of the current trial. That is, the adjustment unit 7 adds one to the number of iteration i of the current trial. Next, at step S114, the adjustment unit 7 determines the trial parameter 105 to perform a trial for the i-th positioning operation. Next, at step S115, the adjustment unit 7 reads the i-th trial parameter 105 from the V trial parameters 105, where V has been set at step S111. The command generation unit 2 then determines the command signal 103 based on the adjustment condition 108 and the trial parameter 105 that has been read. At step S115, the control unit 4 determines the drive power E based on the command signal 103 and on the state sensor signal 101, and performs a positioning operation. In addition, at step S115, the state sensor 5 determines an i-th state sensor signal 101. Next, at step S116, the evaluation unit 6 determines an i-th evaluation result 109, and the adjustment unit 7 receives the i-th evaluation result 109. The i-th evaluation result 109 is the evaluation result of the i-th positioning operation. Next, at step S117, the adjustment unit 7 determines whether the number i is greater than or equal to V. At step S117, if the number i is determined to be less than V, the adjustment unit 7 causes the process to proceed to step S113. The process flow is then repeated from step S113 to step S117 until the number i is determined to be greater than or equal to V at step S117 to perform the first to V-th positioning operations and to determine the evaluation result 109 corresponding to each of the positioning operations.

Alternatively, if the number i is determined to be greater than or equal to V (i≥V), the adjustment unit 7 causes the process to proceed to step S118. At this stage, the foregoing first to V-th positioning operations have been performed, through which the V trial parameters 105 used in the respective positioning operation and the evaluation results 109 corresponding to the respective trial parameters 105 have been obtained. At step S118, the adjustment unit 7 selects the trial parameter 105 that has provided the best performance of positioning control from the V evaluation results 109, and determines that trial parameter 105 to be the excellent parameter 106 under the adjustment condition 108. Note that as described above with reference to FIG. 4, the adjustment unit 7 performs adjustment on each of the adjustment conditions 108 to obtain the excellent parameter 106. Therefore, the operation of the flowchart illustrated in FIG. 4 obtains M excellent parameters 106 in total.

As described above, the trial parameter 105 that provides the best evaluation result 109 corresponding to a single adjustment condition 108 may be determined to be the excellent parameter 106 by performing the process flow from step S111 to step S118. Note that the adjustment method is not limited to the foregoing, but the excellent parameter 106 corresponding to an adjustment condition may be determined using another procedure. In addition, the example of FIG. 6 selects the trial parameter 105 that has caused performing of the best positioning operation as the excellent parameter 106, but the excellent parameter 106 does not necessarily need to be selected from the trial parameters 105. A command parameter that provides the best positioning operation under the adjustment condition 108 can be selected as the excellent parameter 106. The present embodiment has been described in terms of a method for adjusting a command parameter specifying a command pattern to provide excellent performance of positioning control. Another example may be that the control gain for use by the control unit 4 in feedback control or in feedforward control is included in the command parameter, and adjustment is performed to find an optimum value of the control gain.

Figure 7:
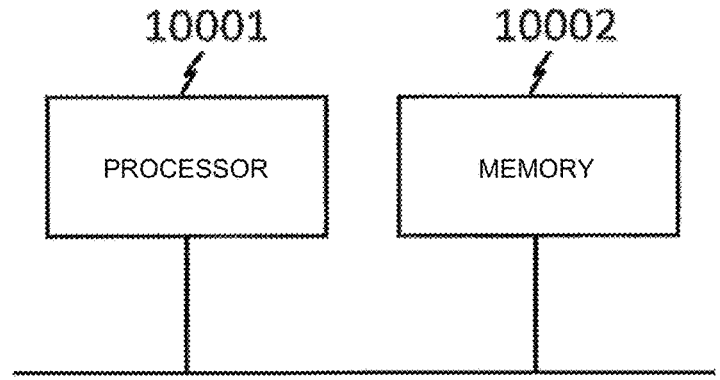
FIG. 7 is a diagram illustrating an example configuration in a case in which processing circuitry included in the positioning control device in the first embodiment includes a processor and a memory.

FIG. 7 is a diagram illustrating an example configuration in a case in which processing circuitry included in the positioning control device 1000 in the present embodiment includes a processor 10001 and a memory 10002. In a case in which the processing circuitry includes the processor 10001 and the memory 10002, each functionality of the processing circuitry of the positioning control device 1000 is implemented in software, firmware, or a combination of software and firmware. The software, firmware, and/or the like are described as a program or programs, and are stored in the memory 10002. In the processing circuitry, each functionality is implemented by the processor 10001 reading and executing a program stored in the memory 10002. That is, the processing circuitry includes the memory 10002 for storing programs that each cause a process of the positioning control device 1000 to be performed. In addition, it can also be said that these programs cause a computer to perform a procedure and a method of the positioning control device 1000.

The processor 10001 may be a central processing unit (CPU), a processing unit, a computing unit, a microprocessor, a microcomputer, a digital signal processor (DSP), or the like. The memory 10002 may be a non-volatile or volatile semiconductor memory such as, a random access memory (RAM), a read-only memory (ROM), a flash memory, an erasable programmable ROM (EPROM), or an electrically erasable programmable ROM (EEPROM) (registered trademark). Alternatively, the memory 10002 may be a magnetic disk, a flexible disk, an optical disk, a compact disc, a MiniDisc, a digital versatile disc (DVD), or the like.

Figure 8:
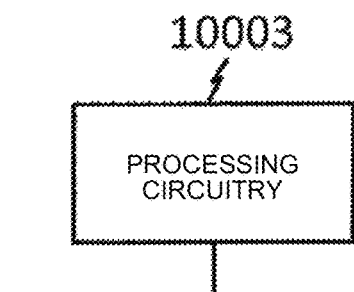
FIG. 8 is a diagram illustrating an example configuration in a case in which processing circuitry included in the positioning control device in the first embodiment includes a dedicated hardware element.

FIG. 8 is a diagram illustrating an example configuration in a case in which processing circuitry included in the positioning control device 1000 in the present embodiment includes a dedicated hardware element. In a case in which the processing circuitry includes a dedicated hardware element, the processing circuitry 10003 illustrated in FIG. 8 may be, for example, a single circuit, a set of multiple circuits, a programmed processor, a parallel programmed processor, an application specific integrated circuit (ASIC), a field programmable gate array (FPGA), or a combination thereof. The functionalities of the positioning control device 1000 may be implemented in individual processing circuitries 10003 on a function-by-function basis, or multiple functionalities may together be implemented in processing circuitry 10003. Note that the positioning control device 1000 and the control target 2000 may be connected with each other via a network. In addition, the positioning control device 1000 may be hosted in a cloud server.

As described above, the present embodiment can provide a positioning control device requiring less time for adjustment and capable of performing a high-performance positioning operation.

Second Embodiment

Figure 9:
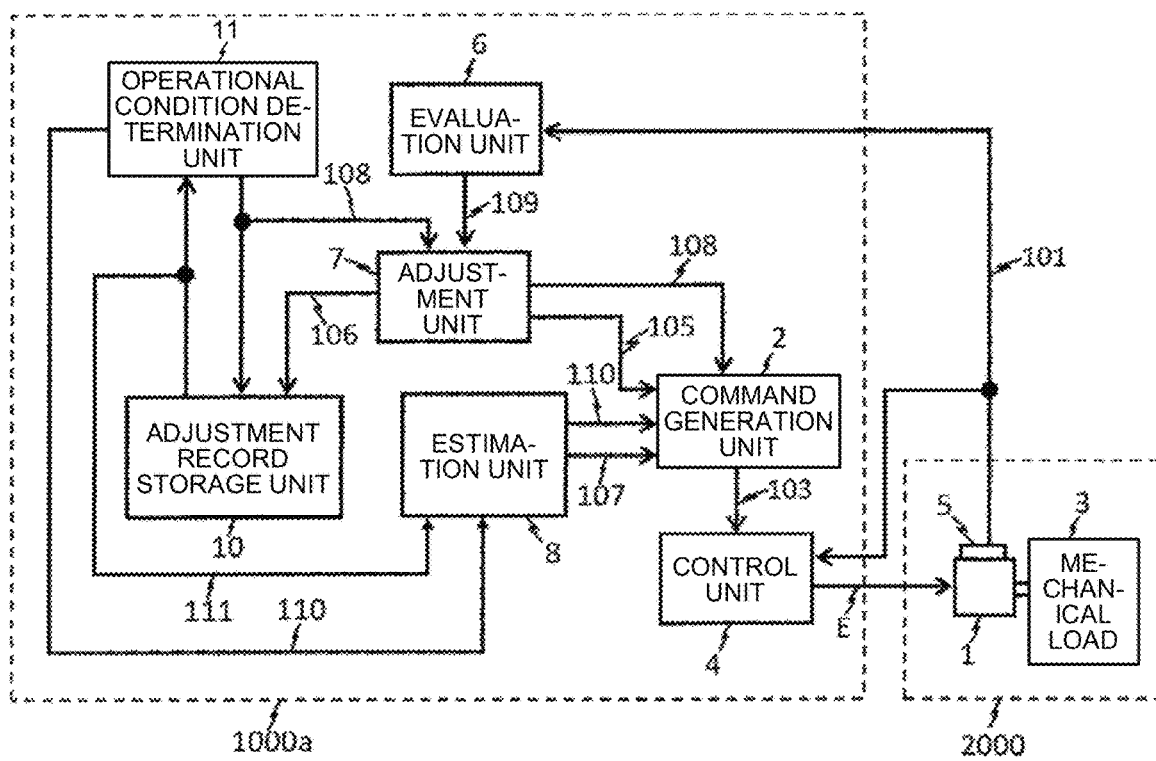
FIG. 9 is a block diagram illustrating an example of a configuration of a positioning control device in a second embodiment.

FIG. 9 is a block diagram illustrating an example of a configuration of a positioning control device 1000a in the present embodiment. The positioning control device 1000a further includes an operational condition determination unit 11 in addition to the components of the positioning control device 1000 of the first embodiment. The operational condition determination unit 11 determines one or both of the adjustment condition 108 and the non-adjustment condition 110 based on the adjustment record 111 or on machine specifications of the control target 2000. More specifically, the operational condition determination unit 11 determines an operational parameter of the adjustment condition 108 or an operational parameter of the non-adjustment condition 110. In the present embodiment, components identical or corresponding to components illustrated in FIG. 1 are designated by the same reference characters as the reference characters of FIG. 1.

The following description refers to the range of an operational condition in which the adjustment condition 108 or the non-adjustment condition 110 is set, as adjustment range. An adjustment range may be the range of an operational parameter. When there are multiple operational parameters, the range of the multiple operational parameters may be defined as the adjustment range, more specifically, the range determined in a multidimensional space having as many dimensions as the number of the operational parameters may be defined as the adjustment range, with respect to an operational condition having the multiple operational parameters. The operational condition determination unit 11 determines a value of an operational parameter of the adjustment condition 108 or the non-adjustment condition 110 within the adjustment range. Note that the set adjustment condition 108 may be stored in tabular form. For example, multiple operational parameters of the adjustment condition 108 may be determined to be arranged equidistantly from one another within the adjustment range.

Figure 10A:
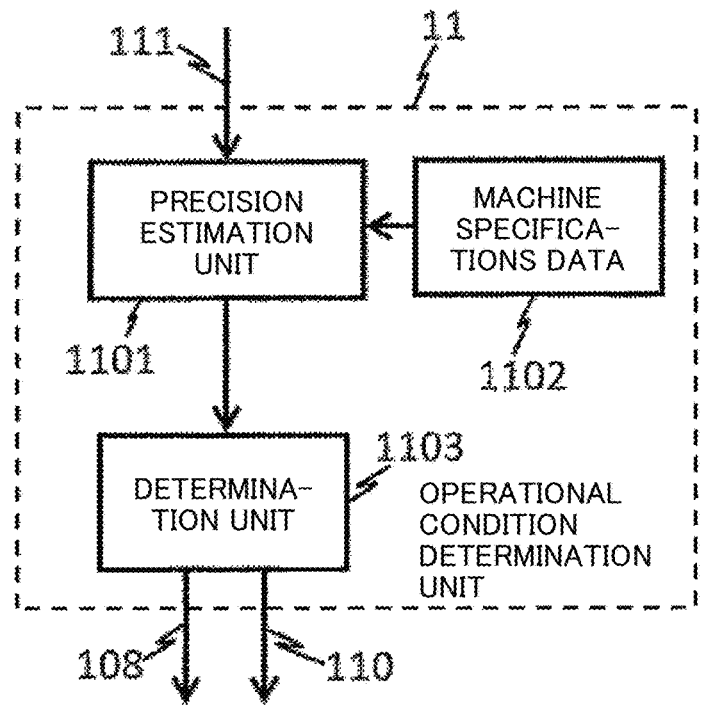
FIG. 10 is a diagram illustrating examples of a configuration of an operational condition determination unit in the second embodiment.

FIG. 10 is a diagram illustrating examples of a configuration of the operational condition determination unit 11 in the present embodiment. The operational condition determination unit 11 illustrated in FIG. 10A includes a precision estimation unit 1101, machine specifications 1102, and a determination unit 1103. The machine specifications 1102 stored are machine specifications of the motor 1, the mechanical load 3, and/or the like. Examples of the machine specifications stored as the machine specifications 1102 include the maximum speed, the maximum acceleration, and the maximum torque of the motor 1, and the degree of inertia of the mechanical load 3. The machine specifications 1102 may be, for example, information stored in and readable from a storage device. The precision estimation unit 1101 estimates, for part or all of the adjustment range, the degree of ease or difficulty for the estimation unit 8 to estimate the estimated excellent parameter 107 with high precision, based on the machine specifications 1102 or on the adjustment record 111.

The estimated excellent parameter 107 is easily estimated with high precision in a certain range, which may be a range in which the difference between the estimated excellent parameter 107 and the excellent parameter 106 is less than the difference in the other part of the adjustment range. Note that the foregoing estimated excellent parameter 107 is an estimated excellent parameter 107 estimated by the estimation unit 8 using an operational condition that falls within such a range as the non-adjustment condition 110. In addition, the excellent parameter 106 is an excellent parameter 106 determined through adjustment performed by the adjustment unit 7 using, as the trial parameter 105, the same operational condition as the foregoing. Moreover, for example, consider a case in which the estimation unit 8 performs estimation using linear interpolation as expressed by Equation (22). In such a case, the precision estimation unit 1101 may determine, in the adjustment range, a portion in which the operational parameter of the adjustment condition 108 and the excellent parameter 106 have a relationship close to a linear relationship to be a high-precision range, based on the adjustment record 111. In addition, a portion in which the relationship therebetween significantly deviates from a linear relationship may be determined to be a low-precision range. The precision estimation unit 1101 may set a high-precision range and a low-precision range as described above.

The determination unit 1103 may increase the density of the adjustment condition 108 in a range in which high-precision prediction is difficult to perform. In addition, the determination unit 1103 may increase the density of the non-adjustment condition 110 in a range in which high-precision prediction is easy to perform. The density of the adjustment condition 108 or of the non-adjustment condition 110 may be the density of the operational parameter. The density of the operational parameter represents the degree of how many operational parameters exist in a certain value range of the operational parameter. That is, when many operational parameters exist in a certain value range of the operational parameter, the operational parameter is described as having a high density.

An operation of the precision estimation unit 1101 will be described below by way of example. It is assumed here that the operational parameter is the target moving distance, and that the mechanical load 3 has a resonance frequency. It is also assumed that the speed and the acceleration of the motor 1 are respectively limited up to the maximum speed and up to the maximum acceleration, and a positioning operation is performed in which the mechanical load 3 is accelerated at the maximum acceleration from a stopped state (zero-speed state) to the maximum speed, next moves at the maximum speed for as long a time as possible, and is then decelerated at the maximum acceleration until the mechanical load 3 is stopped. In such a case, the shape of the speed pattern (command pattern) that shows the temporal change in the speed will ideally be an isosceles trapezoidal shape. It is further assumed that there is a target moving distance at which oscillation is likely to occur, in the adjustment range. At points near such a target moving distance at which oscillation is likely to occur, a value of a command parameter less likely to cause oscillation drastically changes depending on a change in the target moving distance. Accordingly, a range around a target moving distance at which oscillation is likely to occur may be determined to be a low-precision range, in which the estimated excellent parameter 107 is difficult to estimate with high precision. Thus, the foregoing has provided an example of operation of the precision estimation unit 1101.

Note that a range of an operational condition in which the mechanical load 3 is likely to operate according to an analytic expression may be determined to be a high-precision range, in which the estimated excellent parameter 107 is easy to estimate. In addition, the number of low-precision ranges and the number of high-precision ranges may be one or more, and there may be both a high-precision range and a low-precision range in the adjustment range. In a case in which multiple low-precision ranges or high-precision ranges are to be set, the low-precision ranges, the high-precision ranges, or the like may have the same length or have lengths different from one another. In addition, a low-precision range or a high-precision range may be set for all or part of the multiple operational parameters. Thus, according to the configuration of the present embodiment illustrated in FIG. 10A, the adjustment condition 108 or the non-adjustment condition 110 can be set depending on the degree of difficulty in estimation of the estimated excellent parameter 107 performed by the estimation unit 8. This enables a range to be selected that allows effective adjustment in performing adjustment.

Figure 10B:
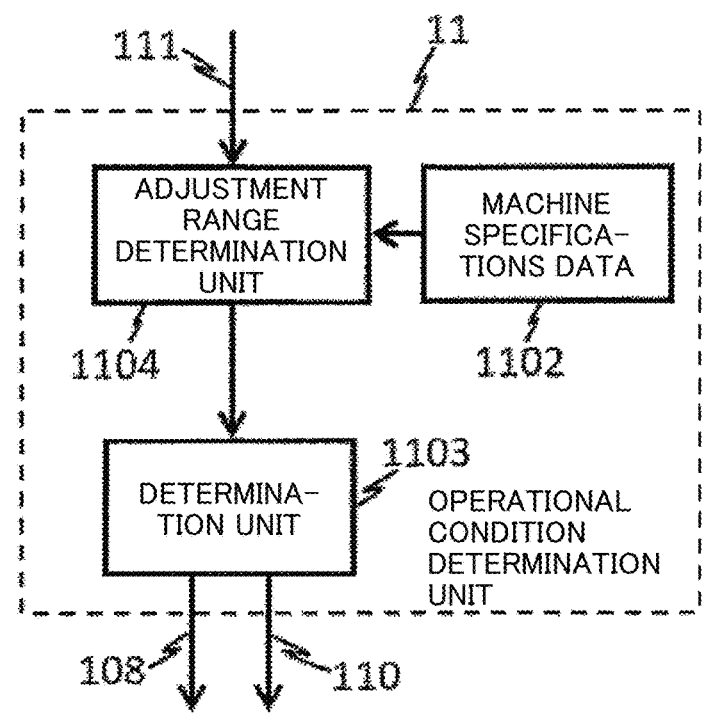

The operational condition determination unit 11 illustrated in FIG. 10B includes an adjustment range determination unit 1104 in place of the precision estimation unit 1101 illustrated in FIG. 10A. Unlike the example configuration illustrated in FIG. 10A, in which the adjustment condition 108 or the non-adjustment condition 110 is determined based on the predetermined adjustment range, the adjustment range determination unit 1104 in the example configuration illustrated in FIG. 10B determines the adjustment range based on the machine specifications 1102 or on the adjustment record 111.

An operation performed by the adjustment range determination unit 1104 to determine the adjustment range will be described below by way of example. It is assumed here that the maximum speed of the motor 1, i.e., Vmax, and the maximum acceleration of the motor 1, i.e., Amax, are stored as the machine specifications 1102. It is also assumed that a positioning operation is performed in which the mechanical load 3 is accelerated at the maximum acceleration from a stopped state (zero-speed state) to the maximum speed, next moves at the maximum speed for as long a time as possible, and is then decelerated at the maximum acceleration. It is further assumed that the adjustment range is given as the target moving distance, which is an operational parameter, and that the adjustment range ranges from a target moving distance of 0 to a target moving distance of Dmax. It is still further assumed that the adjustment range determination unit 1104 determines the adjustment range by determining the maximum value of the target moving distance, i.e., Dmax.

A value $V_{max}^2/A_{max}$ represents the target moving distance when acceleration is performed at the maximum acceleration, deceleration is performed at the maximum acceleration, and the maximum speed is reached at the highest speed point in point-to-point positioning of a motor in which the maximum speed and the maximum acceleration are limited. In such a case, a target moving distance below $V_{max}^2/A_{max}$ results in a triangular shape of the speed pattern (command pattern), meaning that there is no interval of movement at the maximum speed Vmax, and oscillation is likely to occur. Thus, a significant reduction in the positioning time can be expected by performing adjustment. That is, adjustment is very effective.

On the contrary, when the target moving distance is greater than $V_{max}^2/A_{max}$, the shape of the speed pattern (command pattern) is a trapezoidal shape, meaning that there is an interval in which the mechanical load 3 moves at the maximum speed Vmax. In such a case, oscillation is less likely to occur, and therefore a significant reduction in the positioning time cannot be expected by performing adjustment. That is, adjustment is little effective. Thus, it can be said that adjustment is little effective when the target moving distance is greater than $V_{max}^2/A_{max}$, while adjustment is very effective when the target moving distance is less than $V_{max}^2/A_{max}$. In such a case, the adjustment range determination unit 1104 may determine the adjustment range using Equation (30) as follows.

[Formula 30]

$$Dmax = \frac{V_{max}^2}{A_{max}}C \quad (30)$$

In Equation (30), C is a positive constant. The adjustment range determination unit 1104 may determine the range of the target moving distance of Equation (30) from 0 to Dmax to be the adjustment range assuming that the constant C in Equation (30) has a value, for example, in a range from 0.5 to 3. More preferably, the adjustment range determination unit 1104 may determine the range of the target moving distance of Equation (30) from 0 to Dmax to be the adjustment range assuming that the constant C in Equation (30) has a value of 1. Using $V_{max}^2/A_{max}$ as a criterion, such an operation enables a range in which the target moving distance is less than a value equal or approximate to that criterion to be determined as the adjustment range. That is, a range that provides effective adjustment may be determined as the adjustment range to further reduce the time for adjustment. Thus, the foregoing has provided an example of operation of the adjustment range determination unit 1104. The determination unit 1103 assigns the adjustment condition 108 in the adjustment range determined by the adjustment range determination unit 1104. Note that the adjustment conditions 108 or the non-adjustment conditions 110 may be arranged equidistantly from one another within the adjustment range. In addition, a range in which the excellent parameter 106 corresponding to the adjustment condition 108 drastically changes with respect to the operational parameter of the adjustment condition 108 may be determined to be the adjustment range based on the adjustment record 111. In other words, a range of the operational condition in which the excellent parameter 106 significantly changes depending on the adjustment condition 108 may be determined to be the adjustment range based on the adjustment record 111. In addition, a range of the operational condition in which adjustment is very effective in reducing the time required for positioning operation, or adjustment is very effective in reducing oscillation, may be determined to be the adjustment range.

As described above, the present embodiment can provide a positioning control device requiring less time for adjustment and capable of performing a high-performance positioning operation. In addition, the positioning control device according to the present embodiment includes the operational condition determination unit 11, which determines the adjustment condition 108 or the non-adjustment condition 110 based on the machine specifications of the motor 1, on the machine specifications of the mechanical load 3, or on the adjustment record 111.

The operational condition determination unit 11 may include the precision estimation unit 1101, which determines the degree of ease for the estimation unit 8 to estimate the estimated excellent parameter 107 with high precision. Such a configuration enables the number of the adjustment conditions 108 to be increased or decreased depending on the precision of estimation of the estimated excellent parameter 107 within the adjustment range. Thus, setting many adjustment conditions 108 in a low-precision range enables the excellent parameter 106 to be obtained by adjustment without performing estimation, and thus enables efficient adjustment to be performed. In addition, setting many non-adjustment conditions 110 in a high-precision range enables the estimated excellent parameter 107 to be obtained by estimation without performing adjustment. This enables the time for adjustment to be further reduced, and adjustment to be efficiently performed.

Moreover, the operational condition determination unit 11 may include the adjustment range determination unit 1104, which determines the adjustment range, which is the range of an operational condition in which the adjustment condition 108 is set. Such a configuration enables a range in which adjustment is expected to be very effective in reducing the positioning time to be determined as the adjustment range to perform adjustment. This enables the time for adjustment to be further reduced, and adjustment to be efficiently performed.

Third Embodiment

Figure 11:
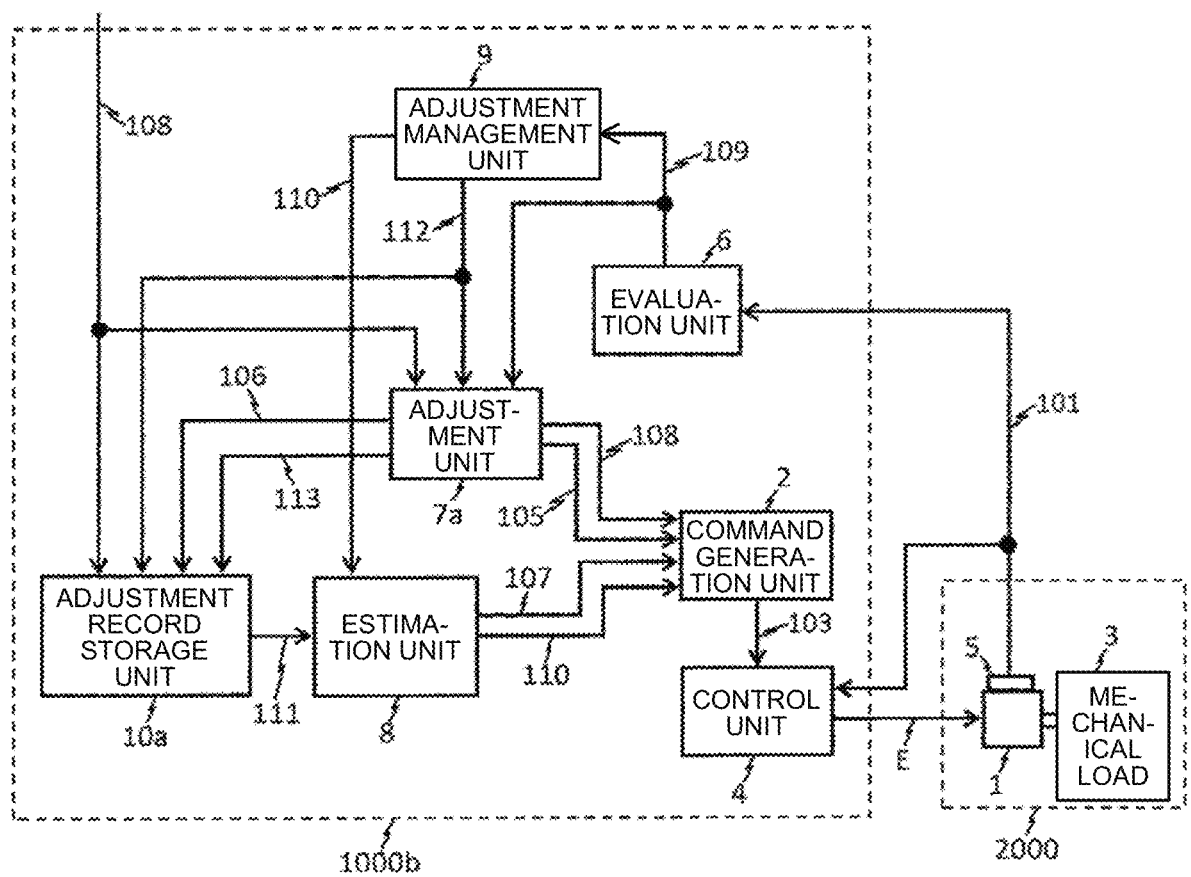
FIG. 11 is a block diagram illustrating an example of a configuration of a positioning control device in a third embodiment.

FIG. 11 is a block diagram illustrating an example of a configuration of a positioning control device 1000*b* in the present embodiment. The positioning control device 1000*b* includes an adjustment unit 7a and an adjustment record storage unit 10a respectively in place of the adjustment unit 7 and the adjustment record storage unit 10 of the positioning control device 1000 of the first embodiment, and includes an adjustment management unit 9 not included in the positioning control device 1000 illustrated in FIG. 1. In the description of FIG. 11, components identical or corresponding to components illustrated in FIG. 1 are designated by the same reference characters as those of FIG. 1.

Differences of the positioning control device 1000b from the positioning control device 1000 are briefly described below. The positioning control device 1000b performs a positioning operation using the non-adjustment condition 110 and the estimated excellent parameter 107. The positioning control device 1000b then determines whether the positioning operation has been performed satisfactorily or unsatisfactorily, and when the positioning operation has been performed unsatisfactorily, determines an additional adjustment condition 112, which is a new operational condition. The adjustment unit 7a then performs adjustment under the additional adjustment condition 112, and determines one of the command parameters to be an additional excellent parameter 113 corresponding to the additional adjustment condition 112.

An operation of the positioning control device 1000b will now be described. The adjustment unit 7a performs adjustment under the adjustment condition 108 similarly to the adjustment unit 7 of the first embodiment. In addition, the adjustment record storage unit 10a stores the adjustment record 111 similarly to the adjustment record storage unit 10 of the first embodiment. The positioning control device 1000 of FIG. 1 is configured such that the estimation unit 8 receives the non-adjustment condition 110 from an external device. In contrast, the positioning control device 1000b of FIG. 11 is configured such that the adjustment management unit 9 determines the non-adjustment condition 110. The positioning control device 1000b of FIG. 11 may also be configured to receive the non-adjustment condition 110 from an external device. The estimation unit 8 of FIG. 11 determines, similarly to the estimation unit 8 of FIG. 1, one of the command parameters to be the estimated excellent parameter 107 corresponding to the non-adjustment condition 110. The adjustment unit 7a further performs a verification positioning operation, which is a positioning operation based on the non-adjustment condition 110 and on the estimated excellent parameter 107. In other words, the adjustment unit 7a causes the command generation unit 2 and the control unit 4 to perform a positioning operation using the non-adjustment condition 110 determined by the adjustment management unit 9 and using the estimated excellent parameter 107 determined by the estimation unit 8. In addition, the adjustment management unit 9 receives the evaluation result 109 about the verification positioning operation from the evaluation unit 6, and determines whether the evaluation result 109 about the verification positioning operation satisfies a predetermined criterion. The verification positioning operation performed by the adjustment unit 7a described above and the determination made by the adjustment management unit 9 are referred to herein collectively as verification.

When the determination result obtained from this verification operation does not satisfy the predetermined criterion, the adjustment management unit 9 determines the additional adjustment condition 112. In this operation, the additional adjustment condition 112 is desirably an operational condition different from the adjustment condition 108 included in the adjustment record 111. The adjustment unit 7a further performs adjustment under the additional adjustment condition 112 determined, and determines one of the command parameters to be the additional excellent parameter 113 corresponding to the additional adjustment condition 112. The adjustment record storage unit 10a stores a pair of the additional adjustment condition 112 and the additional excellent parameter 113 as an additional adjustment record. Note that when the positioning operation performed based on the estimated excellent parameter 107 satisfies the predetermined criterion, a pair of the non-adjustment condition 110 and the estimated excellent parameter 107 may be stored by the adjustment record storage unit 10a as the adjustment record 111. In addition, this pair of the non-adjustment condition 110 and the estimated excellent parameter 107 may also be stored as an additional adjustment record rather than as the adjustment record 111.

Figure 12A:
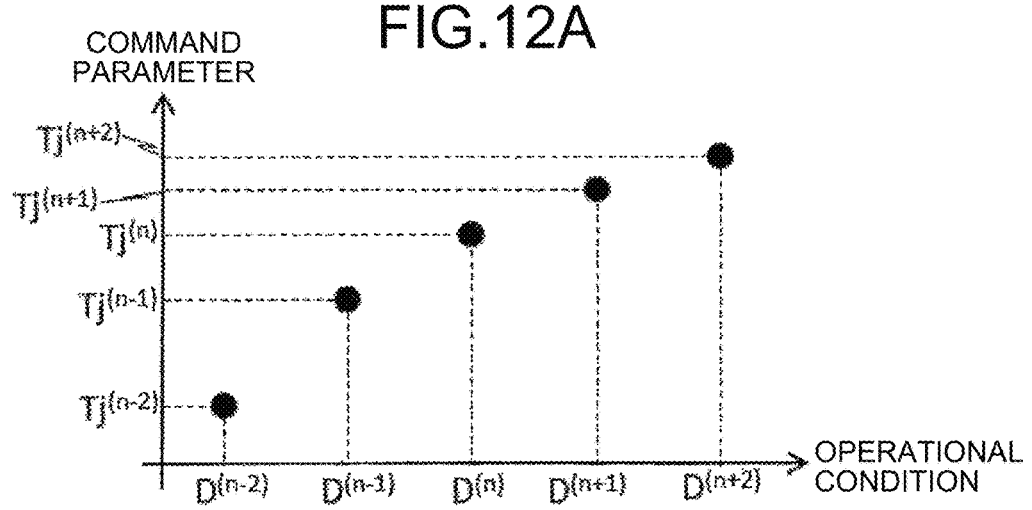
FIG. 12 is a diagram illustrating examples of correspondence relationship between an operational condition and a command parameter in the third embodiment.
Figure 12B:
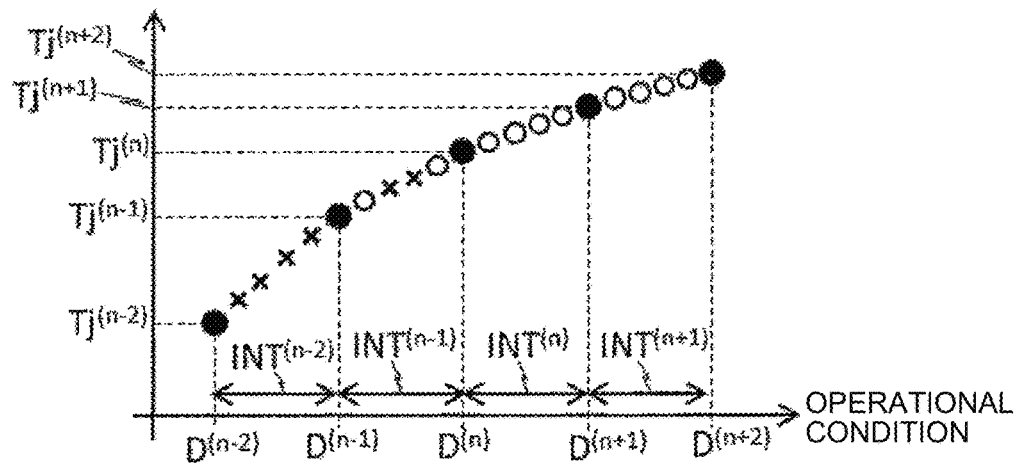

FIG. 12 is a diagram illustrating examples of correspondence relationship between an operational condition and a command parameter in the present embodiment. The horizontal axes of FIG. 12 each represent the operational condition. The vertical axes of FIG. 12 each represent the command parameter. In FIG. 12, the data points, the axes, and the like identical or corresponding to those of FIG. 3 in the first embodiment are indicated by the same reference characters as those in FIG. 3. The reference characters designating the data points, the axes, and the like of FIG. 12A respectively have the same meanings as the reference characters in FIG. 3A. FIG. 12B illustrates, in addition to the data points illustrated in FIG. 12A, data points of the non-adjustment condition 110 and of the estimated excellent parameters 107. A pair of the non-adjustment condition 110 and the estimated excellent parameter 107 is referred to as non-adjustment data. In addition, non-adjustment data that has produced a result of verification determined to satisfy a predetermined criterion, that is, non-adjustment data that has produced a satisfactory result, is indicated by an open mark (white circle mark). Meanwhile, non-adjustment data determined not to satisfy the criterion, that is, non-adjustment data that has produced an unsatisfactory result of verification, is indicated by a cross mark (multiplication symbol). In FIG. 12 the interval of the operational condition between adjacent adjustment conditions 108 is referred to as indeterminate interval. Note that, in addition to such an interval of the operational condition between adjacent adjustment conditions 108, an interval between an end of the adjustment range, which is the range of assignment of the adjustment condition 108, and the adjustment condition 108 adjacent to this end may also be considered as an indeterminate interval. Indeterminate interval $INT^{(n)}$ is an open interval between $D^{(n)}$ and $D^{(n+1)}$, which are operational parameters of two adjustment conditions 108. As expressed by Equation (31), indeterminate interval $INT^{(n)}$ is represented as $(D^{(n)}, D^{(n+1)})$. Note that although the example illustrated in FIG. 12 illustrates four indeterminate intervals from indeterminate interval $INT^{(n-2)}$ to indeterminate interval $INT^{(n+1)}$, the number of indeterminate intervals may be higher or lower depending on the number of the adjustment conditions 108.

[Formula 31]

$$INT^{(n)} = (d^{(n)}, D^{(n+1)}) \tag{31}$$

Figure 12C:
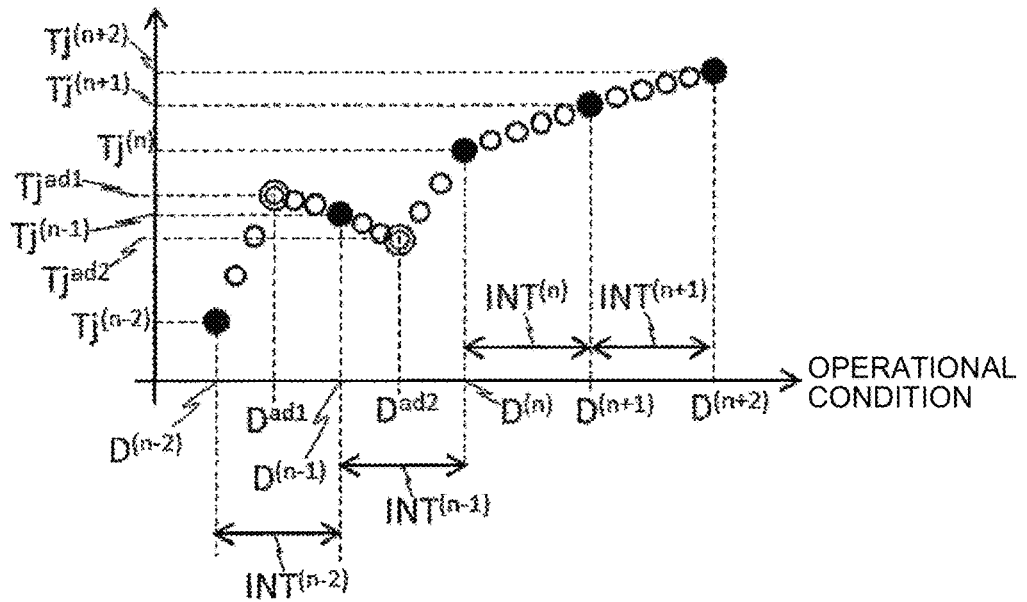

In FIG. 12C, among the data points of non-adjustment data, data points corresponding to a result of verification determined to be satisfactory are marked with a white circle similarly to FIG. 12B, but the data points corresponding to a result of verification determined to be unsatisfactory are not illustrated. Moreover, data points of the additional adjustment condition 112 and of the additional excellent parameter 113 are each indicated by a double circle mark. As described above, a pair of the additional adjustment condition 112 and the additional excellent parameter 113 is referred to as additional adjustment record. FIG. 12B illustrates that there are non-adjustment data corresponding to an unsatisfactory result of verification in indeterminate interval $INT^{(n-2)}$ and in indeterminate interval $INT^{(n-1)}$. The adjustment management unit 9 adds an additional adjustment condition 112 in each of these indeterminate intervals having non-adjustment data corresponding to an unsatisfactory result of verification. That is, the adjustment management unit 9 adds an additional adjustment record in each of indeterminate interval $INT^{(n-2)}$ and indeterminate interval $INT^{(n-1)}$.

The additional adjustment record added in indeterminate interval $INT^{(n-2)}$ is represented by a data point representing a pair of $D^{ad1}$ and $Tj^{ad1}$. The additional adjustment record added in indeterminate interval $INT^{(n-1)}$ is represented by a data point representing a pair of $D^{ad2}$ and $Tj^{ad2}$. As described above, the positioning control device 1000b of the present embodiment performs verification on the non-adjustment data. This enables detection of non-adjustment data resulting in a positioning operation that does not satisfy a criterion. Then, the adjustment management unit 9 can determine, as described above, an additional adjustment condition 112 in an indeterminate interval having non-adjustment data determined to be unsatisfactory in verification, among the indeterminate intervals, each of which is an interval between two adjustment conditions 108. Determination of such an assignment of the additional adjustment condition 112 enables determination of an operational condition that is close to the non-adjustment condition 110 of the non-adjustment data determined to be unsatisfactory, as the additional adjustment condition 112. The phrase that two operational conditions are close to each other may be considered to mean that values of the same operational parameter included in the two operational conditions are close to each other. That is, an additional adjustment condition 112 can be assigned selectively in a portion having low precision of estimation of the estimated excellent parameter 107. Thus, adjustment can be performed efficiently.

Figure 13:
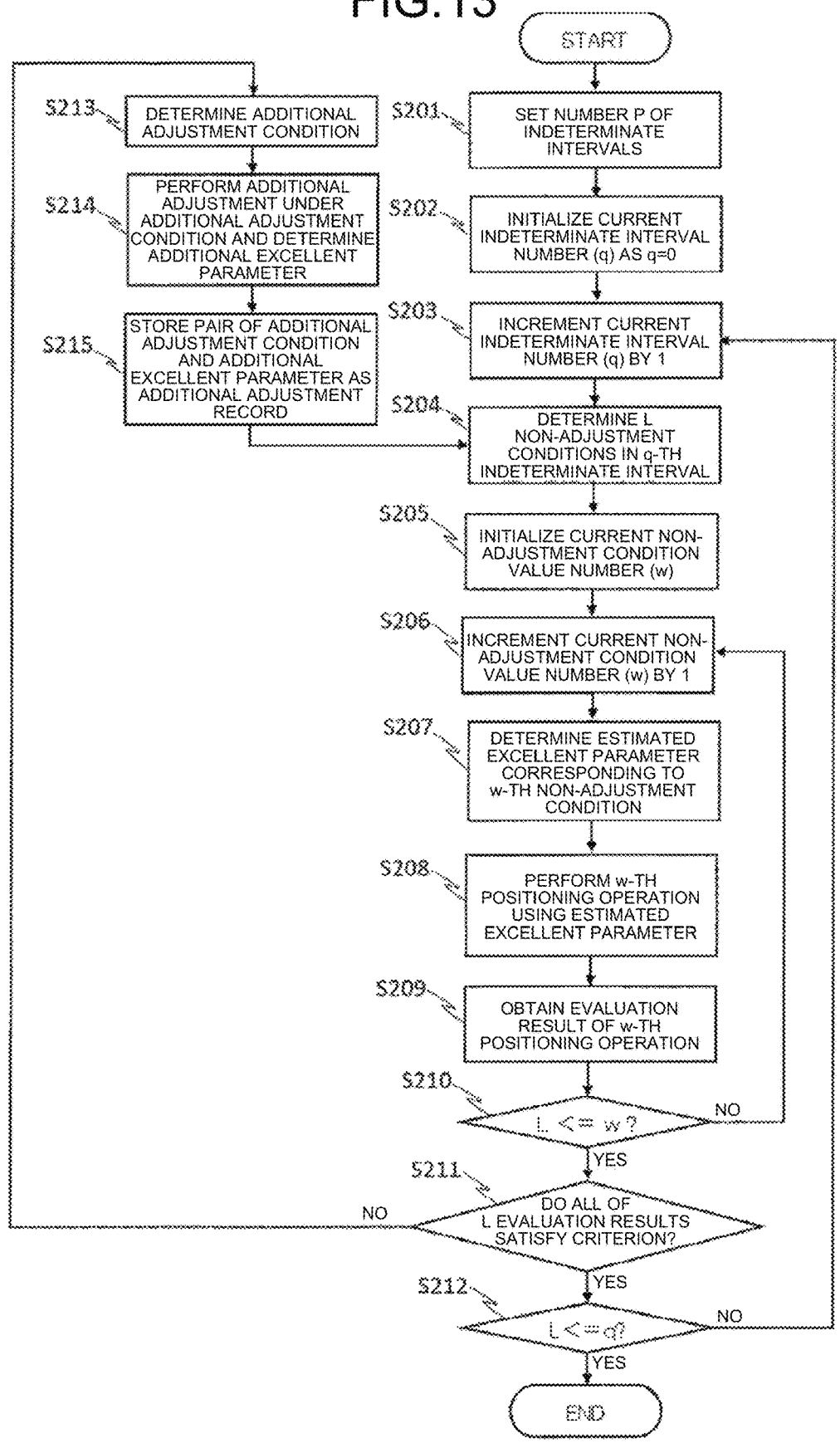
FIG. 13 is a flowchart illustrating an example of operation of the positioning control device in the third embodiment.

FIG. 13 is a flowchart illustrating an example of operation of the positioning control device 1000b in the present embodiment. FIG. 13 illustrates a process flow from when the adjustment records 111 illustrated in FIG. 12A are stored by the adjustment record storage unit 10a until the additional adjustment records of FIG. 12C are stored by the adjustment record storage unit 10a. Note that it is assumed that the adjustment records 111 illustrated in FIG. 12A are already stored in the adjustment record storage unit 10a when the process flow of FIG. 13 starts. After start of the process flow, the adjustment management unit 9 determines, at step S201, the number of indeterminate intervals based on the number of the adjustment conditions 108 stored in the adjustment record storage unit 10a. The number of indeterminate intervals is herein represented by P. Next, at step S202, the adjustment management unit 9 initializes an indeterminate interval number q, which is the number of the indeterminate interval currently being processed (hereinafter, simply current indeterminate interval). Although the operation at step S202 in FIG. 13 initializes the value of q to 0, q may be initialized to another value such as 1.

Next, at step S203, the adjustment management unit 9 increments the number q of the current indeterminate interval. In other words, the adjustment management unit 9 adds one to the number q of the current indeterminate interval.

Next, at step S204, the adjustment management unit 9 determines L non-adjustment conditions 110 in the q-th indeterminate interval. Then, at step S205, the adjustment management unit 9 initializes the number w of the non-adjustment condition under which the process is being processed (hereinafter, simply the number w of the current non-adjustment condition). For example, the value of w may be initialized to 0. This number L representing the number of the non-adjustment conditions 110 to be prepared is desirably large enough to verify the performance of positioning control. The example illustrated in FIG. 12 (a) FIG. 12 determines four non-adjustment conditions 110 in each of the indeterminate intervals, that is, L=4.

Next, at step S206, the adjustment management unit 9 increments the number w of the current non-adjustment condition. In other words, the adjustment management unit 9 performs operation of adding one to the number w of the current non-adjustment condition. Next, at step S207, the estimation unit 8 determines the estimated excellent parameter 107 corresponding to the w-th non-adjustment condition 110. Next, at step S208, the adjustment unit 7a and the like together perform a w-th positioning operation, which is the positioning operation based on the w-th non-adjustment data. Next, at step S209, the adjustment management unit 9 obtains a w-th evaluation result 109 from the evaluation unit 6 based on the state sensor signal 101 obtained in the w-th positioning operation. Next, at step S210, the adjustment management unit 9 determines whether the number w is greater than or equal to L. If the number w is less than L, the process proceeds to step S206. The process flow from step S206 to step S210 is then repeated until the number w is determined to be greater than or equal to L at step S210. Otherwise, if the value-L number w is determined to be greater than or equal to L at step S210, the process proceeds to step S211. At this stage, L evaluation results from the first evaluation result 109 to the L-th evaluation result 109 have been obtained.

At step S211, the adjustment management unit 9 determines whether all the foregoing L evaluation results satisfy a predetermined criterion. At step S211, if all the L evaluation results are determined to satisfy a criterion, the process proceeds to step S212. Alternatively, if at least one of the L evaluation results is determined not to satisfy the criterion at step S211, the process proceeds to step S213. When the process proceeds to step S212, the adjustment management unit 9 determines whether the value L is less than or equal to q. If the value L is less than or equal to q, the process flow is terminated. Alternatively, if the value L is greater than q, the process proceeds to step S203, and the process flow from step S203 to step S212 is repeated until the value L is determined to be less than or equal to q at step S212.

When the process proceeds to step S213, the adjustment management unit 9 determines the additional adjustment condition 112. Then, at step S214, the adjustment unit 7a performs additional adjustment, which is adjustment under the additional adjustment condition 112 to determine the additional excellent parameter 113. Then, at step S215, the adjustment record storage unit 10a stores the pair of the additional adjustment condition 112 and the additional excellent parameter 113 as the additional adjustment record. The process then proceeds to step S204, and the process flow from step S204 to step S215 is repeated until the L evaluation results are determined to satisfy the criterion at step S211.

Note that although the example operation of FIG. 12 has been described in which the entire interval between two adjacent adjustment conditions 108 serves as the indeterminate interval, the indeterminate interval may be part of the interval between two adjacent adjustment conditions 108. For example, an indeterminate interval may be set to exclude, from the indeterminate interval, a portion unlikely to be used in the range of the operational condition. Otherwise, the adjustment management unit 9 may place more indeterminate intervals in a range of the operational condition more likely to be used than in a range of the operational condition less likely to be used, and may assign more additional adjustment conditions 112 in a range of the operational condition more likely to be used, and then perform adjustment focusing on that range. In addition, the distances between pairs of the non-adjustment conditions 110, and the distances between pairs of the non-adjustment condition 110 and the adjustment condition 108 may be set to uniform distances or non-uniform distances. Moreover, in setting of the non-adjustment conditions 110, the non-adjustment conditions 110 may be stochastically determined using a random number.

Although the example operation illustrated in FIG. 12 assigns one additional adjustment condition 112 at the center of each applicable indeterminate interval, two or more additional adjustment conditions 112 may be assigned in an indeterminate interval. In addition, when another operational condition is to be additionally determined as the additional adjustment condition 112 after the additional adjustment condition 112 has been determined, the existing additional adjustment condition 112 may be retained or removed. Moreover, the additional adjustment condition 112 may be changed based on the non-adjustment condition 110 determined to be unsatisfactory in verification. For example, the additional adjustment condition 112 may be assigned at a distance less than a predetermined distance from the non-adjustment condition 110 that has been determined to be unsatisfactory. Efficient adjustment may thus be performed by performing adjustment focusing on a portion near the non-adjustment condition that has been determined to be unsatisfactory. The distance between two operational conditions may refer to the difference between two operational parameters of the same type included in that two operational conditions.

The adjustment management unit 9 illustrated in FIG. 11 determines the additional adjustment condition 112 when the determination result obtained by verification does not satisfy a predetermined criterion. However, the operation of the adjustment management unit 9 of the present embodiment is not limited to such an operation. The adjustment management unit 9 is capable of determining the additional adjustment condition 112, which is one type of operational conditions, also when the adjustment unit 7a and the adjustment management unit 9 do not perform verification. In addition, when verification is performed, the adjustment management unit 9 is capable of determining the additional adjustment condition 112, which is one type of operational conditions, regardless of the result of verification performed. Moreover, due to the capability of performing additional adjustment on an unadjusted operational condition, it is suitable that the adjustment management unit 9 determine an additional adjustment condition 112 that is an operational condition different from the adjustment condition 108. The adjustment unit 7a illustrated in FIG. 11 is capable of performing adjustment under the additional adjustment condition 112 determined as described above, and determining one of the command parameters to be the additional excellent parameter 113 corresponding to the additional adjustment condition 112 determined. In addition, the adjustment record storage unit 10a is capable of storing, as the additional adjustment record, a pair of the additional adjustment condition 112 and the additional excellent parameter 113 corresponding to the additional adjustment condition 112, determined as described above.

As described above, the present embodiment can provide, similarly to the first embodiment, a positioning control device requiring less time for adjustment and capable of performing a high-performance positioning operation. In addition, the positioning control device 1000b of the present embodiment includes the adjustment management unit 9. The adjustment management unit 9 determines the additional adjustment condition 112, which is one type of operational conditions, different from the adjustment condition 108. The adjustment unit 7a then performs adjustment under the additional adjustment condition 112, and determines one of the command parameters to be the additional excellent parameter 113 corresponding to the additional adjustment condition 112. The adjustment record storage unit 10a stores, as the additional adjustment record, a pair of the additional adjustment condition 112 and the additional excellent parameter 113. According to the present embodiment, adjustment can be performed under the additional adjustment condition 112 not included in the adjustment record 111 to determine a command parameter that provides a good evaluation result 109. This enables a positioning control device to be provided that is capable of performing a positioning operation with higher precision.

The adjustment unit 7a further performs a positioning operation based on the non-adjustment condition 110 and on the estimated excellent parameter 107, as a verification positioning operation. The adjustment management unit 9a determines whether the evaluation result 109 based on the state sensor signal 101 obtained in the verification positioning operation satisfies a predetermined criterion. Then, when the criterion is not satisfied, the adjustment management unit 9a determines the additional adjustment condition 112. Thus, a case can be selected in which the result of evaluation about the estimated excellent parameter 107 does not satisfy a criterion, and the additional adjustment condition 112 can be set. This enables adjustment to be efficiently performed without performing unnecessary adjustment.

The adjustment management unit 9 may determine the additional adjustment condition 112 in an indeterminate interval in which a non-adjustment condition 110 is assigned that has been determined to be unsatisfactory, among the indeterminate intervals. The indeterminate intervals may each be an interval of the operational condition between the adjustment conditions 108 adjacent to each other. In addition, an indeterminate interval may be an interval of the operational condition between an end of the adjustment range, which is the range of assignment of the adjustment condition 108, and the adjustment condition 108 adjacent to this end of the adjustment range. The positioning control device of the present embodiment is configured as described above, and can thus determine an additional adjustment condition 112 at a position near the non-adjustment condition 110 that has been determined not to satisfy a criterion. This enables an additional adjustment condition 112 to be determined selectively in a portion having low precision of estimation of the estimated excellent parameter 107.

Moreover, similarly to the operational condition determination unit 11 illustrated in FIGS. 9 and 10, which determines the adjustment condition 108 or the non-adjustment condition 110, the adjustment management unit 9 can also determine an additional adjustment condition 112 using the machine specifications 1102, the adjustment record 111, or the like. In addition, in a case in which the operational condition 108 specifies the target moving distance, the adjustment management unit 9 may determine a reference distance based on a predetermined maximum speed of the motor 1 and on a predetermined maximum acceleration of the motor 1. The adjustment management unit 9 may then determine the additional adjustment condition 112 to cause the target moving distance of the additional adjustment condition 112 to be equal to or less than the above reference distance. The reference distance may be a distance that increases with an increase in the predetermined maximum speed of the motor, and decreases with an increase in the predetermined maximum acceleration of the motor. In addition, it is assumed, for example, that the maximum acceleration of the motor 1 and the maximum speed of the motor 1 are provided as machine specifications of the motor 1. The adjustment management unit 9 may determine the value Dmax in Equation (30) under a condition of C being 1, as the reference distance, and may then determine the additional adjustment condition 112 to cause the target moving distance, which is an operational condition, to be set to a value equal to or less than this reference distance. Such a determination of the additional adjustment condition 112 enables the additional adjustment condition 112 to be set within a range of value that allows the time required for the positioning operation to be significantly reduced by adjustment, that is, within a range that allows effective adjustment.

Fourth Embodiment

Figure 14:
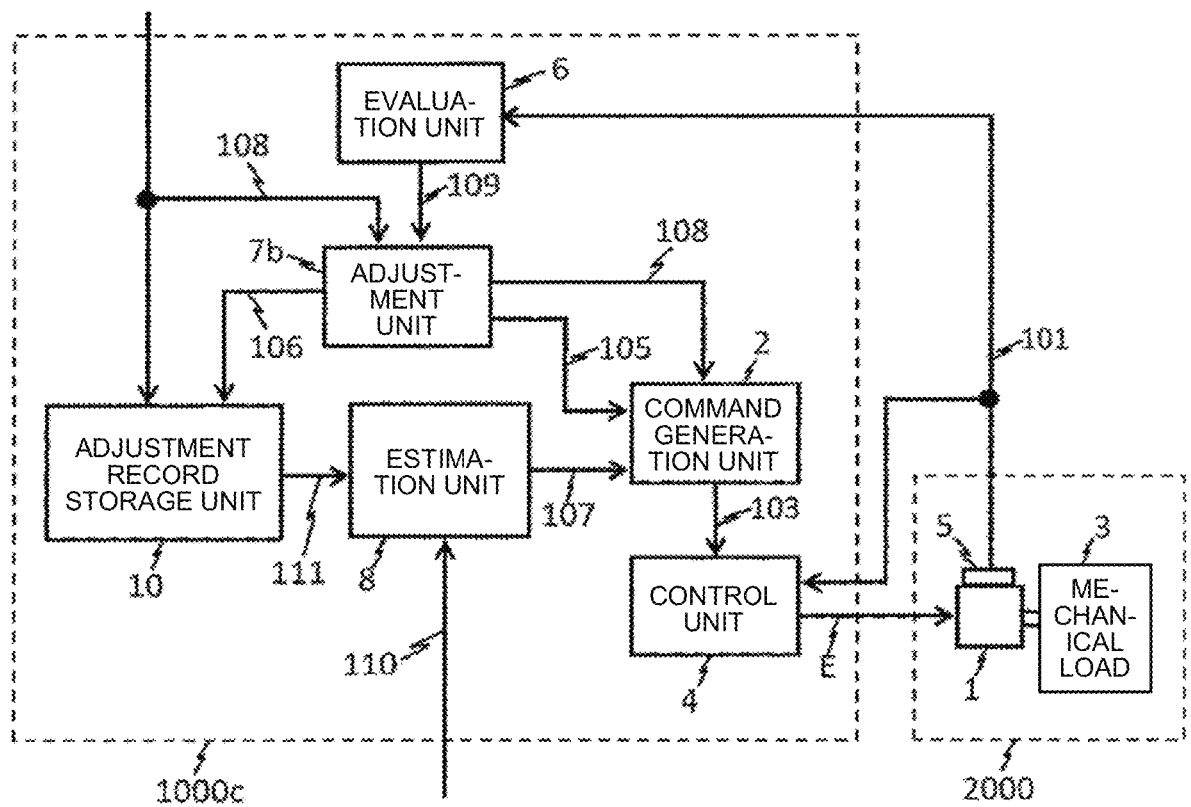
FIG. 14 is a block diagram illustrating an example of a configuration of a positioning control device in a fourth embodiment.
Figure 15:
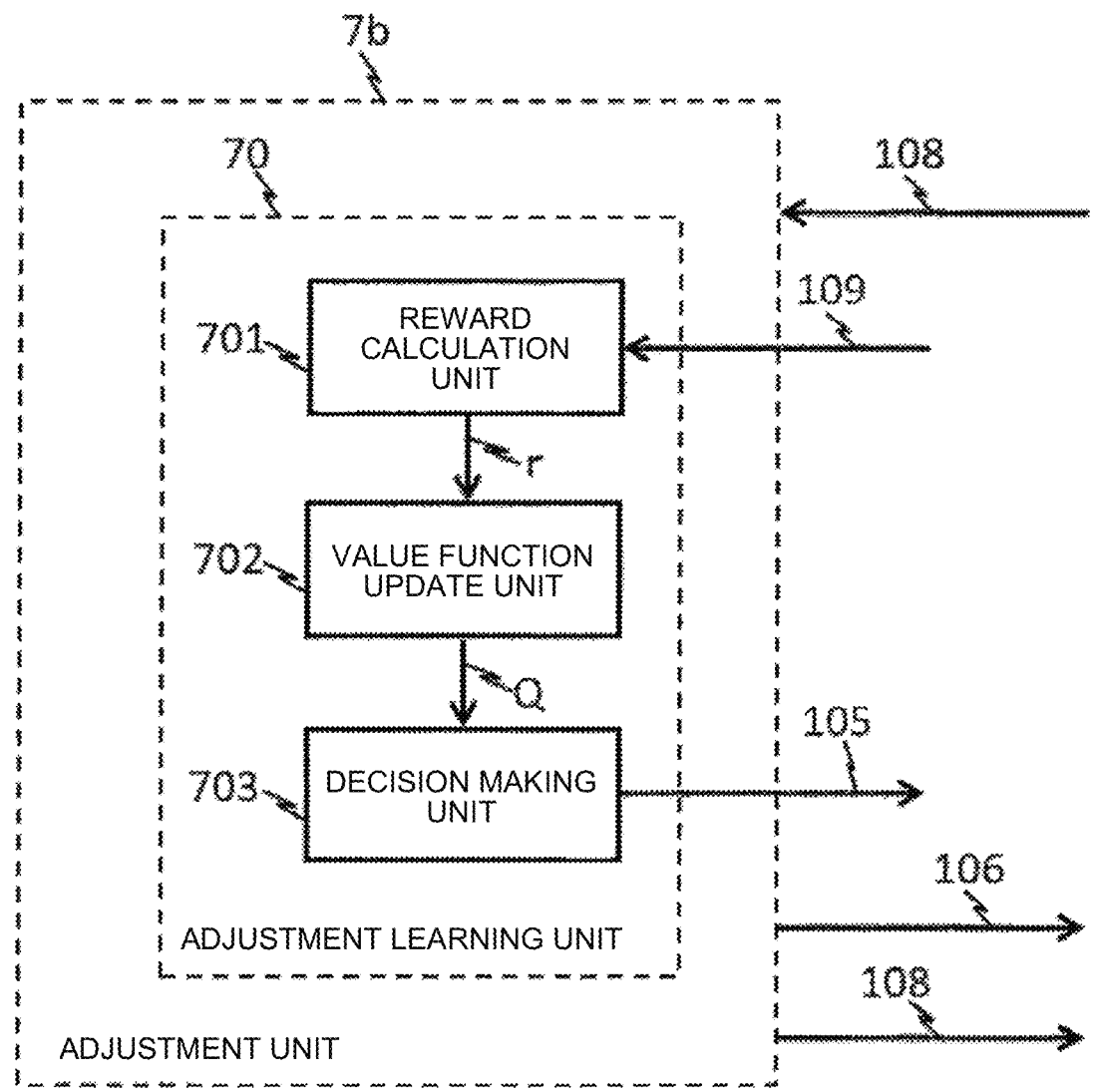
FIG. 15 is a block diagram illustrating an example of a configuration of an adjustment unit in the fourth embodiment.

FIG. 14 is a block diagram illustrating an example of a configuration of a positioning control device 1000c in the present embodiment. The positioning control device 1000c is configured the same as the positioning control device 1000 illustrated in FIG. 1 of the first embodiment except to include an adjustment unit 7b in place of the adjustment unit 7. FIG. 15 is a block diagram illustrating an example of a configuration of the adjustment unit 7b. The adjustment unit 7b includes an adjustment learning unit 70. Among the components illustrated in FIGS. 14 and 15, components identical or corresponding to components illustrated in FIG. 1 of the first embodiment are designated by the same reference characters.

The adjustment learning unit 70 learns the relationship between the trial parameter 105 that has been used in a positioning operation and a state quantity including the evaluation result 109 of the positioning operation performed, and determines the trial parameter 105 based on the result of learning. The adjustment learning unit 70 includes a reward calculation unit 701, which calculates a reward r based on the evaluation result 109, and a value function update unit 702, which updates a value function Q based on the reward r. Note that although the adjustment learning unit 70 of FIG. 15 learns the relationship between the trial parameter 105 and the evaluation result 109, the adjustment learning unit 70 may learn the relationship between the trial parameter 105 and an adjustment state quantity including the evaluation result 109. Examples of the adjustment state quantity include the adjustment condition 108, the machine specifications of the motor 1 or of the mechanical load 3, and an ambient environment such as the temperature or the humidity. The adjustment learning unit 70 also includes a decision making unit 703, which determines, based on the value function Q, the trial parameter 105 for use in positioning operation to be performed in adjustment. In the present embodiment, the adjustment learning unit 70 determines the trial parameter 105 in the operation at step S114 of FIG. 6. The process flow of the present embodiment is similar to the process flows illustrated in FIGS. 4 and 6 of the first embodiment except for the foregoing.

An example of operation performed by the adjustment learning unit 70 to determine the trial parameter 105 will next be described. The adjustment learning unit 70 is capable of performing learning using various learning algorithms. The present embodiment will be described by way of example with respect to a case of use of reinforcement learning. Reinforcement learning is a type of learning in which an agent (one that takes an action) in a certain environment observes a current state, and determines what action to take. The agent selects an action and obtains a reward from the environment. The agent thus learns a policy that provides a highest reward through a sequence of actions. Typical known methods of reinforcement learning include Q-learning and TD-learning. For example, in a case of Q-learning, a general expression for updating an action-value function Q(s, a) is expressed by Equation (32). The updating expression can also be expressed by an action-value table.

[Formula 32]

$$Q(s_t, a_t) \leftarrow Q(s_t, a_t) + a\left(r_{t+1} + \gamma \max_a Q(s_{t+1}, a) - Q(s_t, a_t)\right) \quad (32)$$

In Equation (32), $s_t$ represents the environment at time t, and $a_t$ represents the action at time t. The environment changes to $s_{t+1}$ by the action $a_t$. In addition, $r_{t+1}$ represents the reward obtainable due to that change in the environment, γ represents the discount factor, and a represents the learning rate. Note that the discount factor γ should have a value greater than 0 and less than or equal to 1 (0<γ≤1), and the learning rate a should have a value greater than 0 and less than or equal to 1 (0<α≤1). When Q-learning is used, the action $a_t$ is determination of the trial parameter 105. The environment $s_t$ includes the adjustment condition 108, the initial position of the motor 1, and the like.

An operation to determine the reward r performed by the reward calculation unit 701 will next be described by way of example. The reward calculation unit 701 determines the reward r based on the evaluation result 109. The evaluation unit 6 that has been described in the example in the first embodiment determines the evaluation result 109 based on either the settling time or the positioning time, and on overshoot information. As used herein, overshoot information is, as described above, information about whether the magnitude of the deviation will exceed the tolerance IMP during a time period after the lapse of the settling time until a predetermined time period elapses. The following description describes the overshoot information as representing a satisfactory situation in a case in which the tolerance IMP is exceeded before the predetermined time period elapses, and as representing an unsatisfactory situation in a case in which the tolerance IMP is not exceeded before the predetermined time period elapses. When the overshoot information represents an unsatisfactory situation, five is subtracted from the inverse value of the settling time, and the result is then determined as the reward r. When the overshoot information represents a satisfactory situation, the inverse value of the settling time is determined as the reward r. For example, when the overshoot information represents an unsatisfactory situation, and the settling time is 0.1 seconds, the reward r is determined to be 5, which is the result of subtracting five from the inverse value of the settling time, i.e., 10. The reward calculation unit 701 may determine the reward r as described above to search for a trial parameter 105 that results in a short settling time and overshoot information representing a satisfactory situation. In addition, the evaluation unit 6 may determine the evaluation result 109 based on the amount of overshoot, which is the excess distance from the position corresponding to the target moving distance in the direction opposite the starting point of the positioning operation.

The value function update unit 702 updates the action-value function Q based on the reward r calculated by the reward calculation unit 701. The decision making unit 703 determines an action $a_t$ that maximizes the action-value function Q updated. That is, the decision making unit 703 determines the trial parameter 105 to maximize the action-value function Q. Note that although the positioning control device 1000c has been described with respect to a case of use of reinforcement learning as the learning algorithm used by the adjustment learning unit 70, the learning algorithm of the present embodiment is not limited to reinforcement learning. A known other learning algorithm such as supervised learning, unsupervised learning, or semi-supervised learning can also be used. In addition, the foregoing learning algorithm may be deep learning that learns extraction of feature quantity itself. Otherwise, machine learning may be performed using other method such as, for example, neural network, genetic programming, functional logic programming, support-vector machine, or Bayesian optimization.

In addition, a positioning control device may be configured to include a trained learner that has performed the learning described in the present embodiment. The trained learner may include trained data, a trained program, or a combination thereof. Use of a trained learner enables use of a result of learning of another positioning control device, and thus enables a positioning control device to be provided that is capable of providing high-performance positioning without performing learning anew. In addition, the configuration described in the present embodiment may be applied to the adjustment unit 7 illustrated in FIG. 9 and to the adjustment unit 7a illustrated in FIG. 11 to efficiently perform adjustment.

As described above, the positioning control device 1000c of the present embodiment can embody, similarly to the first embodiment, a positioning control device requiring less time for adjustment and capable of performing a high-performance positioning operation. Furthermore, the positioning control device 1000c of the present embodiment includes the adjustment unit 7b. The adjustment unit 7b includes the adjustment learning unit 70, which learns the relationship between the trial parameter 105 and an adjustment state quantity including the evaluation result 109, and determines the trial parameter 105 based on the result of learning. The trial parameter can be determined by using the result of learning. In addition, the time required for adjustment can be reduced. For example, in a case in which the behavior of the mechanical load 3 is difficult to predict due to a low rigidity of the mechanical load 3 or for another cause, or in a similar case, determination of the trial parameter 105 by the adjustment learning unit 70 using a learning result enables reduction in the time required for adjustment. In addition, the time required for adjustment can be reduced as compared to when simple try-and-error steps are repeated.

Fifth Embodiment

Figure 16:
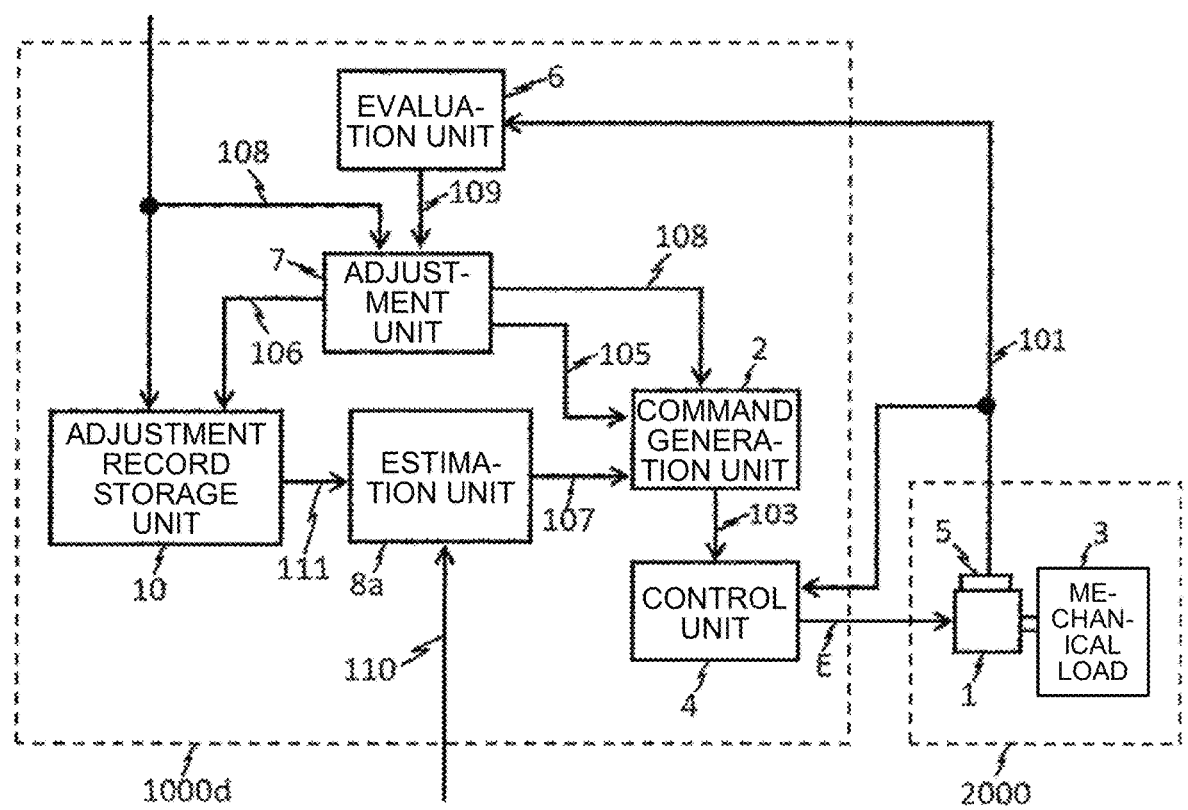
FIG. 16 is a block diagram illustrating an example of a configuration of a positioning control device in a fifth embodiment.

FIG. 16 is a block diagram illustrating an example of a configuration of a positioning control device 1000d in the present embodiment. The positioning control device 1000d includes an estimation unit 8a in place of the estimation unit 8 of the positioning control device 1000 of the first embodiment illustrated in FIG. 1. The other part is the same as the positioning control device 1000 of the first embodiment. The description of the positioning control device 1000d designates components identical or corresponding to the components in FIG. 1 of the first embodiment using the same reference characters.

Figure 17:
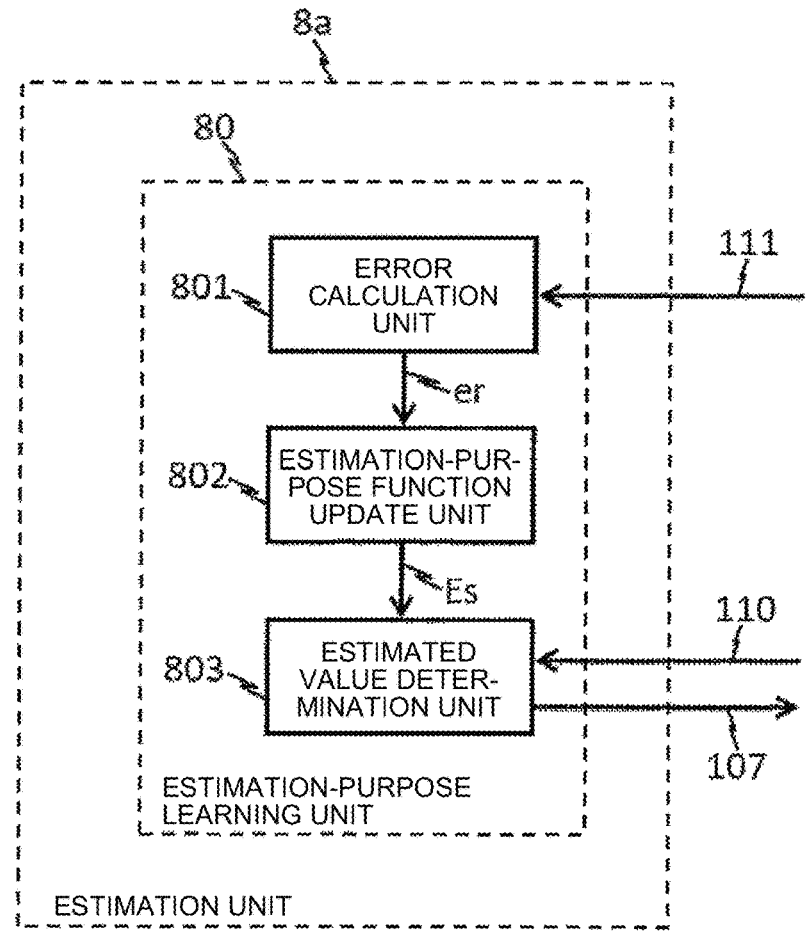
FIG. 17 is a block diagram illustrating an example of a configuration of an estimation unit in the fifth embodiment.

FIG. 17 is a block diagram illustrating an example of a configuration of the estimation unit 8a in the present embodiment. The estimation unit 8a learns the relationship between the adjustment condition 108 and the excellent parameter 106 corresponding to the adjustment condition 108, based on an estimation state quantity including the adjustment record 111. The estimation unit 8a then determines, based on the result of learning, one of the command parameters to be the estimated excellent parameter 107 under the non-adjustment condition 110. A command parameter leading to performing a positioning operation that provides a good evaluation result 109 may be determined to be the estimated excellent parameter 107 under the non-adjustment condition 110. In the following description, the estimation unit 8a includes, by way of example, an estimation-purpose learning unit 80, which learns an estimation-purpose function Es that calculates an estimated excellent parameter based on the non-adjustment condition 110. The estimation-purpose learning unit 80 includes an error calculation unit 801, which calculates an error er between the adjustment record 111 and the estimated excellent parameter 107, and an estimation-purpose function update unit 802, which updates the estimation-purpose function Es based on the error er. The estimation-purpose learning unit 80 also includes an estimated value determination unit 803, which determines the estimated excellent parameter 107 based on the estimation-purpose function Es and on the non-adjustment condition 110. Note that the error calculation unit 801 in FIG. 17 calculates the error er based on the adjustment record 111, but may calculate the error er based on an estimation state quantity including the adjustment record 111.

The estimation-purpose learning unit 80 may learn the relationship between the excellent parameter 106 and the adjustment condition 108 using, for example, so-called supervised learning based on a neural network model. Supervised learning is a model that, given a large number of pairs of data each including an input and a result (label) to a learning device, learns a feature of these datasets, and infers a result from an input. A neural network includes an input layer consisting of multiple neurons, an intermediate layer (hidden layer) consisting of multiple neurons, and an output layer consisting of multiple neurons. There may be one intermediate layer or two or more intermediate layers.

Figure 18:
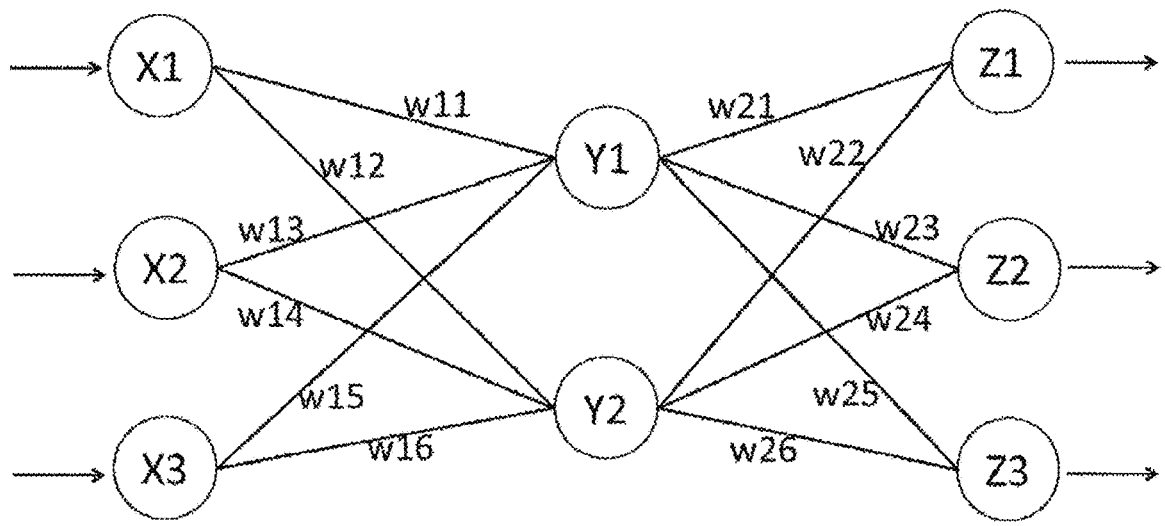
FIG. 18 is a diagram illustrating an example of a configuration of a neural network in the fifth embodiment.

FIG. 18 is a diagram illustrating an example of a configuration of a neural network in the present embodiment. For clarity of illustration, the neural network of FIG. 18 has three inputs and three layers. Input of multiple inputs to the input layer having neurons X1 to X3 causes values obtained by multiplication of the input values by weight W1 including w11 to w16 to be input to the intermediate layer having neurons Y1 and Y2. Then, values obtained by multiplication of the input values input to the intermediate layer by weight W2 including w21 to w26 are output from the output layer having neurons Z1 to Z3. These output results vary depending on the value of weight W1 and on the value of weight W2. The neural network illustrated in FIG. 18 learns the relationship between the adjustment condition 108 and the excellent parameter 106 corresponding to the adjustment condition 108 using supervised learning based on the dataset generated based on the adjustment record 111 input to the estimation-purpose learning unit 80. That is, in one example of learning performed by a neural network of the present embodiment, weight W1 and weight W2 are adjusted to make excellent the evaluation result 109 of positioning operation that uses the excellent parameter 106 output from the output layer when the adjustment condition 108 is input to the input layer. Note that a positioning control device may be configured to include a trained learner that has performed the learning described in the present embodiment. The trained learner may include trained data, a trained program, or a combination thereof. Use of a trained learner enables use of a result of learning of another positioning control device, and thus enables a positioning control device to be provided that is capable of providing high-performance positioning without performing learning anew.

In addition, the configuration described in the present embodiment may be applied to another component. Examples of the another component include the estimation unit 8 of the positioning control device 1000a illustrated in FIG. 9, the estimation unit 8 of the positioning control device 1000b illustrated in FIG. 11, and the estimation unit 8 of the positioning control device 1000c illustrated in FIG. 14. The positioning control device 1000a, the positioning control device 1000b, or the positioning control device 1000c may then perform the estimation of the estimated excellent parameter 107 with high precision or efficiently.

As described above, the present embodiment can provide, similarly to the first embodiment, a positioning control device requiring less time for adjustment and capable of performing a high-performance positioning operation. Furthermore, the positioning control device 1000d of the present embodiment includes the estimation unit 8a including the estimation-purpose learning unit 80. The estimation-purpose learning unit 80 learns the relationship between the excellent parameter 106 and the adjustment condition 108 based on an estimation state quantity including the adjustment record 111, and then determines the estimated excellent parameter 107 based on the result of learning. This enables the estimated excellent parameter 107 to be determined in a shorter time with higher precision. This also enables the excellent parameter 106 that can provide a positioning operation that provides a good evaluation result 109 to be efficiently determined in a shorter time even for a mechanical load 3 having a complex characteristic.

REFERENCE SIGNS LIST 1 motor; 2 command generation unit; 3 mechanical load; 4 control unit; 5 state sensor; 6 evaluation unit; 7, 7a, 7b adjustment unit; 8, 8a estimation unit; 9 adjustment management unit; 10, 10a adjustment record storage unit; 11 operational condition determination unit; 70 adjustment learning unit; 80 estimation-purpose learning unit; 101 state sensor signal; 103 command signal; 105 trial parameter; 106 excellent parameter; 107 estimated excellent parameter; 108 adjustment condition; 109 evaluation result; 110 non-adjustment condition; 111 adjustment record; 112 additional adjustment condition; 113 additional excellent parameter; 701 reward calculation unit; 702 value function update unit; 703 decision making unit; 801 error calculation unit; 802 estimation-purpose function update unit; 803 estimated value determination unit; 1000, 1000a, 1000b, 1000c positioning control device; 1102 machine specifications; 2000 control target; $INT^{(n)}$ indeterminate interval.

The invention claimed is:

1. A positioning control device in which motion of a motor in a positioning operation of causing a mechanical load mechanically connected to the motor to move by a target moving distance is specified by operational conditions and by command parameters, the command parameters being parameters changeable under the operational conditions, the positioning control device comprising:
adjustment circuitry to perform adjustment in which the positioning operation is performed based on an adjustment condition and on a trial parameter, and one of the command parameters is determined to be an excellent parameter corresponding to the adjustment condition based on an evaluation result, the adjustment condition being one type of the operational conditions, the trial parameter being one type of the command parameters, the evaluation result being based on a state sensor signal that represents a state of any one of a position, a speed, or an acceleration of the motor or of the mechanical load detected during the positioning operation performed;
adjustment record memory to store a pair of the adjustment condition and the excellent parameter corresponding to the adjustment condition, as an adjustment record;
estimation circuitry to determine, based on the adjustment record, one of the command parameters to be an estimated excellent parameter corresponding to a non-adjustment condition, the non-adjustment condition being one type of the operational conditions different from the adjustment condition stored as the adjustment record; and
adjustment management circuitry to determine an additional adjustment condition that is one type of the operational conditions different from the adjustment condition, wherein
the adjustment circuitry performs the adjustment under the additional adjustment condition determined by the adjustment management circuitry, and determines one of the command parameters to be an additional excellent parameter corresponding to the additional adjustment condition,
the adjustment record memory further stores a pair of the additional adjustment condition and the additional excellent parameter, as an additional adjustment record,
the adjustment circuitry performs the positioning operation based on the non-adjustment condition and on the estimated excellent parameter, as a verification positioning operation, and
the adjustment management circuitry determines whether an evaluation result based on the state sensor signal obtained in the verification positioning operation satisfies a predetermined criterion, and when the criterion is not satisfied, performs determination of the additional adjustment condition.

2. The positioning control device according to claim 1, comprising operational condition determination circuitry to determine the adjustment condition or the non-adjustment condition based on a machine specification of at least one of the motor or the mechanical load or on the adjustment record.

3. The positioning control device according to claim 1, wherein
a range of the operational condition in which the adjustment condition is assigned is specified as an adjustment range, the operational conditions to be both ends of the adjustment range are each specified as an adjustment range end, and an indeterminate interval being an interval of the operational condition is specified as an interval between two adjacent adjustment conditions included in the adjustment record or as an interval between the adjustment condition included in the adjustment record and adjacent to the adjustment range end and the adjustment range end, and the adjustment management circuitry determines the additional adjustment condition to cause the additional adjustment condition to be assigned in the indeterminate interval within which the non-adjustment condition determined not to satisfy the criterion is assigned.

4. The positioning control device according to claim 1, wherein
the operational conditions include operational parameters being numerical parameters with respect to the motion of the motor, and the target moving distance is one of the operational parameters, and
the estimation circuitry estimates the estimated excellent parameter using a linear interpolation function that approximates the operational parameters and the excellent parameters respectively as an input and an output.

5. The positioning control device according to claim 1, wherein determination of the operational conditions and the command parameters determines a maximum value of acceleration of the motor in the positioning operation performed based on the operational conditions and on the command parameters.

6. The positioning control device according to claim 1, wherein the adjustment circuitry determines multiple trial parameters depending on the adjustment condition, performs the positioning operation on each of pairs of the adjustment condition and the respective trial parameters determined, and determines one of the command parameters as the excellent parameter corresponding to the adjustment condition, based on the evaluation result based on the state sensor signal obtained in the positioning operation.

7. The positioning control device according to claim 1, wherein
the estimation circuitry
determines the estimated excellent parameter to cause a highest acceleration value in the positioning operation performed based on the non-adjustment condition and on the estimated excellent parameter corresponding to the non-adjustment condition to be less than a highest acceleration value in all the positioning operations each performed based on the adjustment condition and on the excellent parameter corresponding to the adjustment condition included in the adjustment record.

8. The positioning control device according to claim 1, further comprising:
evaluation circuitry to evaluate the trial parameter based on the state sensor signal, and to determine the evaluation result, wherein
the evaluation circuitry determines the evaluation result based on a positioning time, the positioning time being a time period from a start of the positioning operation until a deviation falls below a predetermined value, the deviation being a difference between a position of the mechanical load and the target moving distance.

9. The positioning control device according to claim 1, further comprising:
evaluation circuitry to evaluate the trial parameter based on the state sensor signal, and to determine the evaluation result, wherein
the evaluation circuitry determines the evaluation result based on an amount of overshoot, the amount of overshoot being an excess distance of a position of the mechanical load from a position corresponding to the target moving distance in a direction opposite a starting point of the positioning operation with respect to an ending point of the positioning operation.

10. The positioning control device according to claim 1, wherein the adjustment circuitry includes adjustment learning circuitry to learn a relationship between an adjustment state quantity including the evaluation result and the trial parameter, and to determine the trial parameter based on a result of learning.

11. The positioning control device according to claim 1, wherein the estimation circuitry includes estimation-purpose learning circuitry to learn a relationship between the excellent parameter and the adjustment condition based on an estimation state quantity including the adjustment record, and to determine the estimated excellent parameter based on a result of learning.

12. The positioning control device according to claim 1, wherein
the operational condition specifies the target moving distance,
the adjustment management circuitry sets a reference distance, the reference distance being a distance that increases with an increase in a predetermined maximum speed of the motor, and decreases with an increase in a predetermined maximum acceleration of the motor, and
the adjustment management circuitry further determines the additional adjustment condition to cause the target moving distance of the additional adjustment condition to be equal to or less than the reference distance.

13. The positioning control device according to claim 1, wherein when the criterion is satisfied, the adjustment record memory stores a pair of the non-adjustment condition and the estimated excellent parameter as the adjustment record or as the additional adjustment record.

14. The positioning control device according to claim 1, wherein the adjustment circuitry includes adjustment learning circuitry to determine the trial parameter based on a trained model trained about a relationship between an adjustment state quantity including the evaluation result and the trial parameter.

15. The positioning control device according to claim 1, wherein the estimation circuitry includes estimation-purpose learning circuitry to determine the estimated excellent parameter based on a trained model trained about a relationship between the excellent parameter and the adjustment condition based on an estimation state quantity including the adjustment record.

16. A positioning control method in which motion of a motor in a positioning operation of causing a mechanical load mechanically connected to the motor to move by a target moving distance is specified by operational conditions and by command parameters, the command parameters being parameters changeable under the operational conditions, the positioning control method comprising:
performing adjustment in which the positioning operation is performed based on an adjustment condition and on a trial parameter, and one of the command parameters is determined to be an excellent parameter corresponding to the adjustment condition based on an evaluation result under the adjustment condition, the adjustment condition being one type of the operational conditions, the trial parameter being one type of the command parameters, the evaluation result being based on a state sensor signal that represents a state of any one of a position, a speed, or an acceleration of the motor or of the mechanical load detected during the positioning operation performed;

storing a pair of the adjustment condition and the excellent parameter corresponding to the adjustment condition, as an adjustment record;

determining, based on the adjustment record, one of the command parameters to be an estimated excellent parameter corresponding to a non-adjustment condition, the non-adjustment condition being one type of the operational conditions different from the adjustment condition stored as the adjustment record;

determining an additional adjustment condition that is one type of the operational conditions different from the adjustment condition;

performing the adjustment under the additional adjustment condition determined, and determining one of the command parameters to be an additional excellent parameter corresponding to the additional adjustment condition;

further storing a pair of the additional adjustment condition and the additional excellent parameter, as an additional adjustment record;

performing the positioning operation based on the non-adjustment condition and on the estimated excellent parameter, as a verification positioning operation; and determining whether an evaluation result based on the state sensor signal obtained in the verification positioning operation satisfies a predetermined criterion, and when the criterion is not satisfied, performing determination of the additional adjustment condition.

* * * * *